United States Patent
Yamanouchi et al.

(10) Patent No.: US 9,847,761 B2
(45) Date of Patent: Dec. 19, 2017

(54) TRANSMISSION APPARATUS AND TRANSMISSION METHOD

(71) Applicant: NEC CORPORATION, Tokyo (JP)

(72) Inventors: Shingo Yamanouchi, Tokyo (JP); Atsushi Honda, Tokyo (JP)

(73) Assignee: NEC CORPORATION, Tokyo (JP)

(*) Notice: Subject to any disclaimer, the term of this patent is extended or adjusted under 35 U.S.C. 154(b) by 42 days.

(21) Appl. No.: 14/888,472

(22) PCT Filed: May 14, 2014

(86) PCT No.: PCT/JP2014/062865
§ 371 (c)(1),
(2) Date: Nov. 2, 2015

(87) PCT Pub. No.: WO2014/185459
PCT Pub. Date: Nov. 20, 2014

(65) Prior Publication Data
US 2016/0191003 A1 Jun. 30, 2016

(30) Foreign Application Priority Data
May 16, 2013 (JP) .................. 2013-103931

(51) Int. Cl.
*H03F 3/68* (2006.01)
*H03F 3/21* (2006.01)
(Continued)

(52) U.S. Cl.
CPC .......... *H03F 3/211* (2013.01); *H03F 1/0277* (2013.01); *H03F 3/19* (2013.01); *H03F 3/245* (2013.01);
(Continued)

(58) Field of Classification Search
CPC . H03F 3/211; H03F 3/19; H03F 3/245; H03F 2203/21157; H03F 2200/39;
(Continued)

(56) References Cited

U.S. PATENT DOCUMENTS

| 4,439,740 A | * | 3/1984 | Harrington | ............... H03F 1/52 330/124 R |
| 5,304,943 A | * | 4/1994 | Koontz | .................. H03F 3/602 330/124 R |

(Continued)

FOREIGN PATENT DOCUMENTS

| JP | 4-321305 A | 11/1992 |
| JP | 5-63458 A | 3/1993 |

(Continued)

OTHER PUBLICATIONS

International Search Report for PCT/JP2014/062865 dated Aug. 19, 2014.
(Continued)

*Primary Examiner* — Khanh V Nguyen
(74) *Attorney, Agent, or Firm* — Sughrue Mion, PLLC

(57) ABSTRACT

A transmission apparatus is provided with: a plurality of amplification units that amplify RF signals arranged in at least 2 bands; a first control unit that selects amplification units that perform an amplification operation, from among the plurality of amplification units, in accordance with total power of RF signals to be transmitted; a second control unit which, in accordance with a power ratio of the RF signals to be transmitted in respective bands, changes the power ratio of the RF signals in the respective bands while keeping constant the total power of the RF signals received at each of the selected amplification units; and a combining unit that combines the RF signals outputted by the selected amplification units.

10 Claims, 21 Drawing Sheets

(51) Int. Cl.
 *H03F 3/72*     (2006.01)
 *H03F 3/19*     (2006.01)
 *H03F 3/24*     (2006.01)
 *H03F 3/60*     (2006.01)
 *H04B 1/00*     (2006.01)
 *H03F 1/02*     (2006.01)
 *H03F 1/07*     (2006.01)

(52) U.S. Cl.
 CPC .............. *H03F 3/602* (2013.01); *H03F 3/72* (2013.01); *H04B 1/005* (2013.01); *H03F 1/0288* (2013.01); *H03F 1/07* (2013.01); *H03F 2200/111* (2013.01); *H03F 2200/39* (2013.01); *H03F 2200/451* (2013.01); *H03F 2200/541* (2013.01); *H03F 2203/21142* (2013.01); *H03F 2203/21157* (2013.01); *H03F 2203/7209* (2013.01); *H03F 2203/7215* (2013.01); *H03F 2203/7236* (2013.01)

(58) Field of Classification Search
 CPC ......... H03F 2200/451; H03F 2200/541; H03F 2203/21142; H03F 1/0277; H03F 3/602; H04B 1/005
 USPC ...................................... 330/124 R, 126, 295
 See application file for complete search history.

(56) References Cited

U.S. PATENT DOCUMENTS

| | | | |
|---|---|---|---|
| 5,781,066 A * | 7/1998 | Parisi | H03F 1/526 330/124 D |
| 5,886,573 A * | 3/1999 | Kolanek | H03F 1/0277 330/10 |
| 6,118,343 A * | 9/2000 | Winslow | H03F 3/68 330/295 |
| 8,315,578 B2 * | 11/2012 | Zhu | H04B 1/0483 455/102 |
| 8,537,153 B2 * | 9/2013 | Wu | H03F 3/45475 345/209 |
| 8,824,978 B2 * | 9/2014 | Briffa | H03F 1/32 330/124 R |
| 2014/0118072 A1 * | 5/2014 | Briffa | H03F 1/025 330/295 |

FOREIGN PATENT DOCUMENTS

| | | |
|---|---|---|
| JP | 2005-223827 A | 8/2005 |
| JP | 2006-222828 A | 8/2006 |
| JP | 2010-28632 A | 2/2010 |

OTHER PUBLICATIONS

Paul Saad et al., "Design of a Concurrent Dual-Band 1.8-2.4-Ghz GaN-HEMT Doherty Power Amplifier", IEEE Transactions on Microwave Theory and Techniques, Jun. 2012, vol. 60, No. 6, pp. 1840-1849.

Alireza Shirvani et al., "A CMOS RF Power Amplifier With Parallel Amplification for Efficient Power Control", IEEE Journal of Solid-State Circuits, Jun. 2002, vol. 37, No. 6, pp. 684-693.

Gang Liu et al., "Fully Integrated CMOS Power Amplifier With Efficiency Enhancement at Power Back-Off", IEEE Journal of Solid-State Circuits, Mar. 2008, vol. 43, No. 3, pp. 600-609.

* cited by examiner

TRANSMISSION APPARATUS AND TRANSMISSION METHOD

CROSS-REFERENCE TO RELATED APPLICATIONS

This application is a National Stage of International Application No. PCT/JP2014/062865 filed May 14, 2014, claiming priority based on Japanese Patent Application No. 2013-103931 filed May 16, 2013, the contents of all of which are incorporated herein by reference in their entirety.

FIELD

The present invention relates to a transmission apparatus and a transmission method. In particular, the invention relates to a transmission apparatus and a transmission method, where RF (Radio Frequency) signals arranged in a plurality of bands are transmitted.

BACKGROUND

Among component elements of wireless communication equipment, power consumption is high in power amplifiers for transmitted signals used in the wireless communication equipment. Therefore, improvement in power efficiency of power amplifiers is a high priority need in the development of wireless communication equipment. In recent years, in wireless communication standards (for example, LTE (Long Term Evolution) standard), linear modulation is mainly used for spectral efficiency improvement. With linear modulation, demands regarding signal distortion are high. Therefore, in order to maintain linearity in a power amplifier, average output power is set to a value below saturated output power, so that instantaneous maximum output power (peak power output) is below saturated output. However, in a power amplifier, the more the average output power is lowered from saturated output power to a low ratio, the lower the ratio (power efficiency) of DC (direct current) power supply to the power amplifier with extracted transmission power. From the viewpoint of power saving, a decrease in power efficiency is not acceptable.

In order to solve this type of problem, various methods exist, where the transmission power of a power amplifier is digitally controlled. However, a problem occurs in that when transmission power is digitally controlled, quantization error is generated.

Patent Literature (PTL) 1 and Non-Patent Literature (NPL) 1 disclose a control system in which, by continuously (analogically) controlling the amplitude of RF signals received by a power amplifier carrying an LSB (Least Significant Bit), among a plurality of power amplifiers, quantization error generated by another power amplifier is corrected.

Patent Literature 2 discloses technology to continuously (analogically) control output power of a power amplifier so as to correct quantization error generated by another power amplifier, by continuously (analogically) controlling power supply voltage of a power amplifier carrying an LSB.

Non-Patent Literature 2 discloses a transmission apparatus that uses λ/4 lines and digitally controls transmission power of a power amplifier. Non-Patent Literature 3 discloses λ/4 lines that can be used as output combining elements.

PTL 1: Japanese Patent Kokai Publication No. JPH05-63458A

PTL 2: Japanese Patent Kokai Publication No. JPH04-321305A

Non-Patent Literature

NPL 1: Gang Liu, Peter Haldi, Tsu-Jae King Liu and Ali M. Niknejad "Fully Integrated CMOS Power Amplifier With Efficiency Enhancement at Power Back-Off", IEEE JOURNAL OF SOLID-STATE CIRCUITS, VOL. 43, NO. 3, pp. 600-69 March 2008

NPL 2: Alireza Shirvani, David K. Su and Bruce A. Wooley "A CMOS RF Power Amplifier With Parallel Amplification for Efficient Power Control", IEEE JOURNAL OF SOLID-STATE CIRCUITS, VOL. 37, NO. 6, pp. 684-693, June 2002.

NPL 3: Paul Saad, Paolo Colantonio, Luca Piazzon, Franco Giannini, Kristoffer Andersson and Christian Fager "Design of a Concurrent Dual-Band 1.8-2.4-GHz GaN-HEMT Doherty Power Amplifier" IEEE TRANSACTIONS ON MICROWAVE THEORY AND TECHNIQUES, VOL. 60, NO. 6, pp. 1840-1849, June 2012

SUMMARY

It is to be noted that the respective disclosures of the abovementioned cited technical literature are incorporated herein by reference thereto. The following analysis is given according to the present inventors.

In recent years, in wireless communication standards there is a demand for multiband to be used in transmission and reception of signals in multiple bands. This is because, by making transmission apparatuses multiband, it is possible to realize higher speed communication and highly reliable communication without interruption. In methodology for realizing a multiband transmission apparatus, a method may be envisaged in which transmission apparatuses that transmit single bands are individually provided, as shown in FIG. 20, for example.

A transmission apparatus 200-1 shown in FIG. 20 transmits an RF signal 34 in band 1 (carrier frequency f1). A transmission apparatus 200-2 transmits an RF signal 35 in band 2 (carrier frequency f2). As shown in FIG. 20, application to dual band (2 band transmission) is possible by using the 2 transmission apparatuses 200-1 and 200-2. Since the number of applicable bands increases in proportion to the number of transmission apparatuses, transmission in 3 or more bands is possible if 3 or more transmission apparatuses are arranged.

However, in the transmission apparatus shown in FIG. 20, there is an increase in the number of output combining elements (for example, transformer elements) that combine waveforms outputted by a plurality of power amplifiers disposed therein, roughly in proportion to the number of bands (that is, the number of transmission apparatuses). In the case of FIG. 20 for example, in the overall apparatus the number of output combining elements must be double the number of output combining elements included in 1 transmission apparatus. In addition, since the number of transmission apparatuses increases in proportion to the number of bands, the number of power amplifiers required also increases in proportion to the number of bands.

Furthermore the size of an output combining element is large, so that a problem occurs when a transmission apparatus is made multiband. For example, in a case of implementing the abovementioned output combining elements by discrete parts, the size of the transmission apparatus increases to the extent that the number of output combining elements increases. Or, in a case where output combining elements are implemented in an IC (Integrated Circuit), the area and cost of the IC increase to the extent that the number of output combining elements increases.

In view of the abovementioned situation, it is an object of the present invention to provide a transmission apparatus and a transmission method, which, when the transmission apparatus is made into a multiband transmission apparatus, contribute to curbing an increase in the number of output combining elements and to realizing power saving.

According to a first aspect of the present invention, there is provided a transmission apparatus comprising: a plurality of amplification units that amplify RF signals arranged in at least 2 bands; a first control unit that selects amplification units that perform an amplification operation, from among the plurality of amplification units in accordance with total power of RF signals to be transmitted; a second control unit which, in accordance with a power ratio of the RF signals to be transmitted in respective bands, changes the power ratio of the RF signals in the respective bands while keeping constant the total power of the RF signals received at each of the selected amplification units; and a combining unit that combines the RF signals outputted by the selected amplification units.

According to a second aspect of the present invention, there is provided a transmission method of amplifying RF signals by a plurality of amplification units, and transmitting the RF signals, the method comprising: amplifying RF signals arranged in at least 2 bands in a plurality of amplification units; selecting amplification units that perform an amplification operation, from among the plurality of amplification units, in accordance with total power of RF signals to be transmitted; changing, in accordance with a power ratio of the RF signals to be transmitted in respective bands, the power ratio of the RF signals in the respective bands while keeping constant the total power of the RF signals received at each of the selected amplification units; and combining the RF signals outputted by the selected amplification units. It is to be noted that the present method is associated with a particular mechanism, referred to an amplification unit that amplifies RF signals.

According to the respective aspects of the present invention, there is provided a transmission apparatus and a transmission method, which, when the transmission apparatus is made into a multiband transmission apparatus, contribute to curbing an increase in the number of output combining elements and to realizing power saving.

PREFERRED MODES

Figure 1:
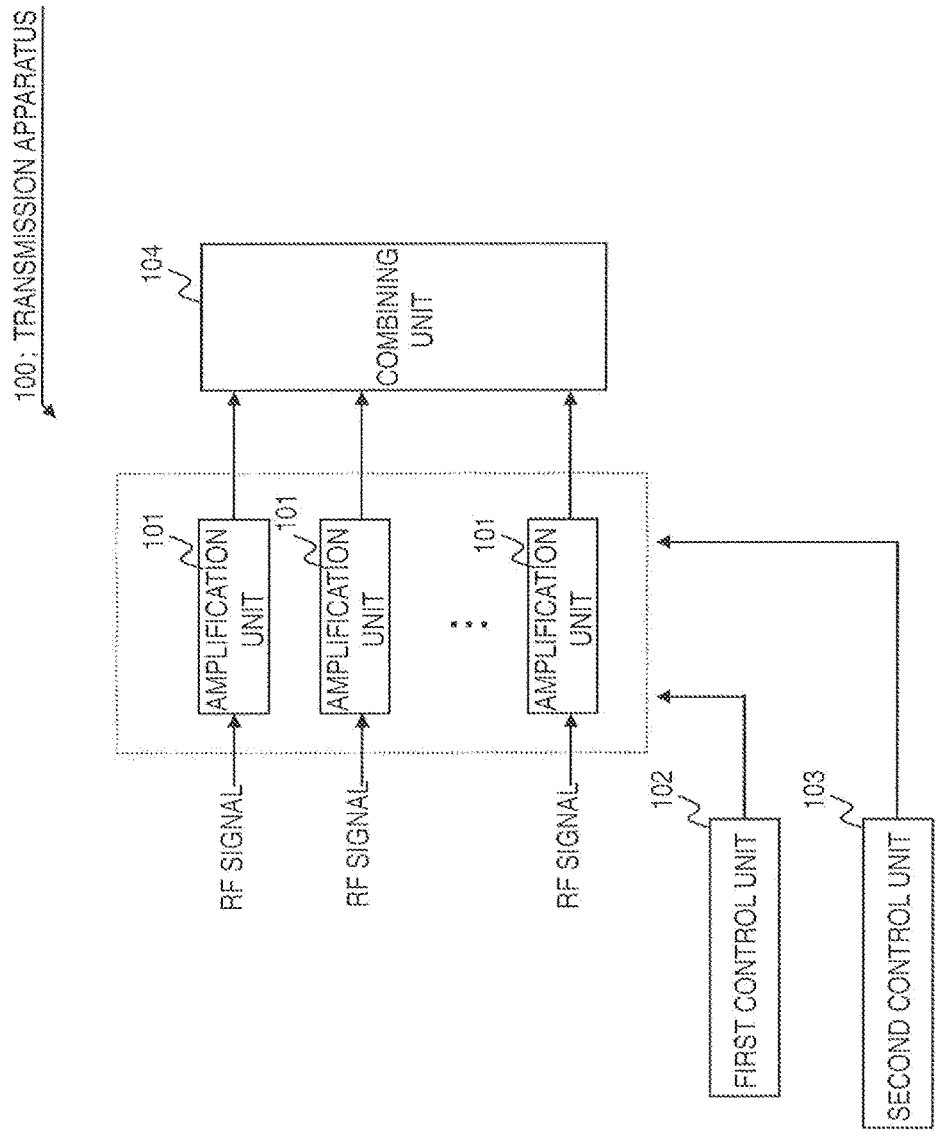
FIG. 1 is a diagram for describing an outline of an exemplary embodiment.

First, a description is given concerning an outline of an exemplary embodiment using FIG. 1. It is to be noted that reference symbols in the drawings attached to this outline are added to respective elements for convenience, as examples in order to aid understanding, and there is no intention to limit the invention in any way.

As described above, a transmission apparatus is desired in which, when the transmission apparatus is made multiband, an increase in the number of output combining elements is curbed and power saving is realized. In other words, it is desired to realize a multiband transmission apparatus while keeping power consumption of the transmission apparatus low.

Accordingly, as an example, a transmission apparatus 100 shown in FIG. 1 is provided. The transmission apparatus 100 is provided with: a plurality of amplification units 101 that amplify RF signals arranged in at least 2 bands; a first control unit 102 that selects amplification units 101 that perform amplification operations, from among the plurality of amplification units 101, in accordance with total power of RF signals to be transmitted; a second control unit 103 which, in accordance with a power ratio of the RF signals to be transmitted in respective bands, changes the power ratio of the RF signals in the respective bands while keeping constant the total power of RF signals received at each of the selected amplification units 101; and a combining unit 104 that combines the RF signals outputted by the selected amplification units.

The transmission apparatus 100 reduces power consumption by discretely (digitally) controlling the size of total output power of the transmitted RF signals. In addition, the second control unit 103 performs control to keep constant the total power of the received signals, so that each of the selected amplification units 101 performs a saturated operation. By the amplification units 101 performing saturated operations, it is possible to perform amplification of RF signals with high power efficiency in the respective amplification units 101. That is, by having the total power of the RF signals arranged in the plurality of bands at a constant value (for example, saturated output power) in each of the amplification units 101, it is possible to realize the multiband transmission apparatus 100, while keeping the power consumption of the transmission apparatus 100 low.

A more detailed description is given concerning specific exemplary embodiments below, making reference to the drawings.

First Exemplary Embodiment

A more detailed description is given concerning a first exemplary embodiment, using the drawings.

It is to be noted that in the respective drawings shown below, the same reference symbols are attached to the same or equivalent parts, and descriptions thereof are not repeated.

Figure 2:
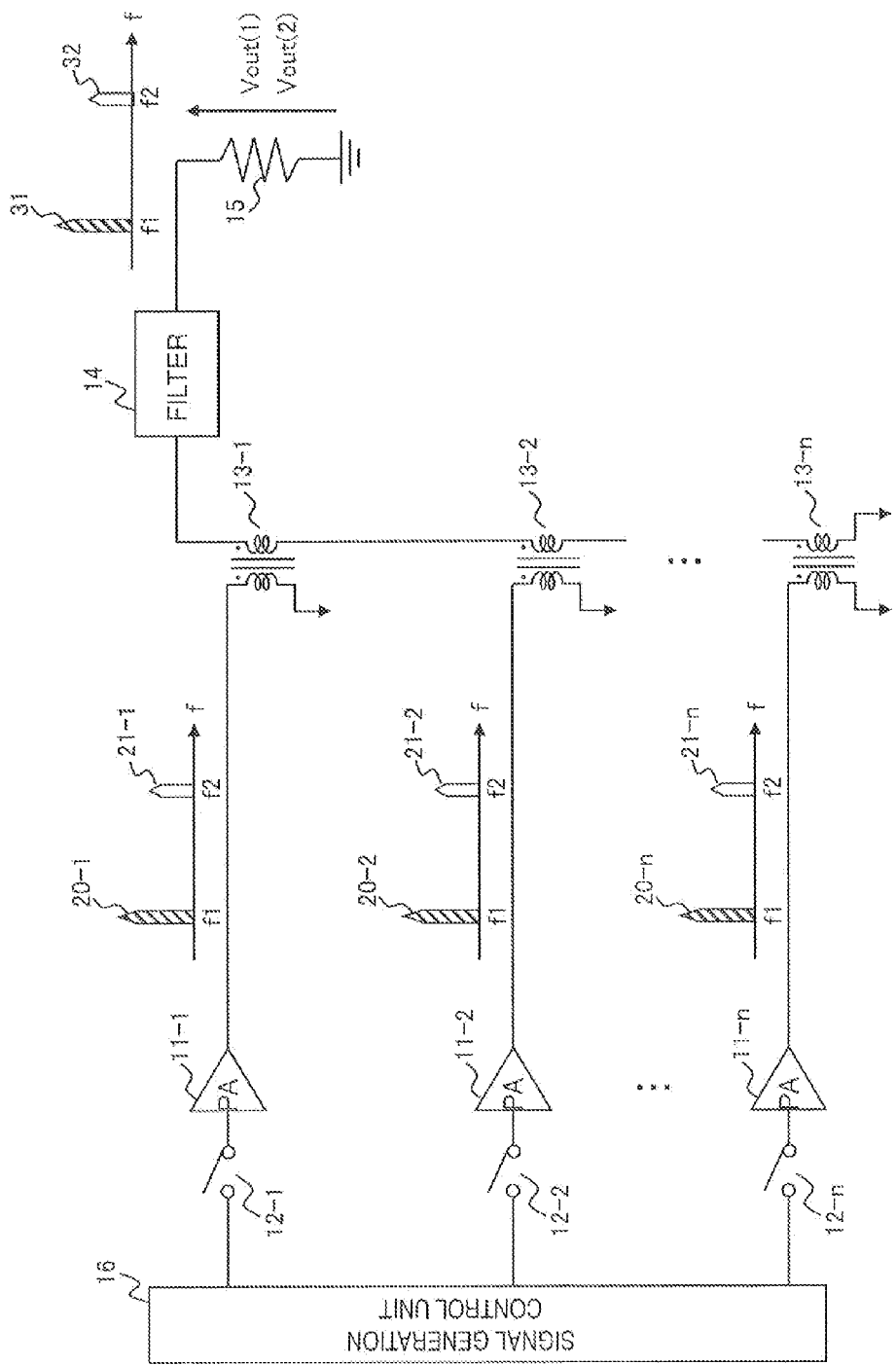
FIG. 2 is a diagram showing a circuit configuration of a transmission apparatus 10 according to a first exemplary embodiment.

FIG. 2 is a diagram showing a circuit configuration of the transmission apparatus 10 according to a first exemplary embodiment. Referring to FIG. 2, the transmission apparatus 10 has a configuration including at least: a plurality of power amplifiers 11-1 to 11-n, a plurality of switches 12-1 to 12-n, a plurality of transformer elements 13-1 to 13-n, a filter 14, a load 15, and a signal generation control unit 16. Note that n is a positive integer, and this applies also to the description below.

Also, in the description below, when there is no particular reason to distinguish among the power amplifiers 11-1 to 11-n, the expression "power amplifier 11" is used. Similarly for the switches 12-1 to 12-n and the transformer elements 13-1 to 13-n, the expressions "switch 12" and "transformer element 13" are used. In addition, for $\lambda/4$ lines 18-1 to 18-n described below, the expression "$\lambda/4$ line(s) 18" is used.

In the transmission apparatus 10, output of the plurality of power amplifiers 11 is combined by the transformer elements 13. The combined output of the power amplifiers 11 combined by the transformer elements 13 is outputted by an antenna, which is a load 15, via the filter 14. In this way, the transmission apparatus 10 is provided with a combining unit formed of the plurality of transformer elements 13, and the number of the plurality of transformer elements 13 and the number of the plurality of power amplifiers 11 are same. The primary side of each transformer element 13 is connected with a corresponding power amplifier 11, and secondary sides of the transformers 13 are connected in series.

The signal generation control unit 16 has a role of modulator to modulate transmission data supplied from a high level signal source (not illustrated in the drawings) connected to the transmission apparatus 10, using a carrier wave included in 2 bands, and generates RF signals arranged in a plurality of bands. In the first exemplary embodiment, the signal generation control unit 16 outputs RF signals included in 2 bands to each of the power amplifiers 11. The respective RF signals are each amplified by the power amplifiers 11 and outputted to a corresponding transformer element 13. That is, the transmission apparatus 10 is provided with a plurality of the power amplifiers 11, which amplify the RF signals arranged in at least 2 bands.

In FIG. 2, an RF signal 20-i in band 1 (carrier frequency f1) and an RF signal 21-i in band 2 (carrier frequency f2) are respectively outputted from a power amplifier 11-i (i is any integer from 1 to n; this also applies below). The RF signal 20-i in band 1 outputted from the power amplifier 11-i is combined with another RF signal in a transformer element 13, and is outputted to the load 15 as a combined RF signal 31 in band 1 via the filter 14.

The RF signal 21-i in band 2 outputted from the power amplifier 11-i is combined with another RF signal in the transformer element 13, and is outputted to the load 15 as a combined RF signal 32 in band 2 via the filter 14.

In the transmission apparatus 10, the respective power amplifiers 11 are continuously controlled to be in an ON state in which saturated output power is outputted, or an OFF state in which power is not outputted. That is, the signal generation control unit 16 discretely (digitally) controls output power to the load 15 by selecting power amplifiers 11 to be operated, from among the plurality of power amplifiers 11. As a means of switching the ON/OFF state of the power amplifiers 11, use is made of switches 12 disposed between the signal generation control unit 16 and an input terminal of the power amplifiers 11. It is to be noted that the signal generation control unit 16 and the switches 12 are connected by control lines, not illustrated in the drawings, and it is possible to switch the ON/OFF state of the switches 12 by the signal generation control unit 16.

By switching the ON/OFF state of the switches 12 in accordance with total power of transmitted RF signals, the signal generation control unit 16 performs a first control operation of selecting power amplifiers 11 that perform an amplification operation, among the plurality of power amplifiers 11. The signal generation control unit 16 performs a second control operation of changing the power ratio of RF signals in each band, while keeping constant the total power of RF signals received, in each of the selected power amplifiers 11, in accordance with the power ratio of transmitted RF signals in each band. By combining the first control operation and the second control operation, the signal generation control unit 16 limits quantization error to less than or equal to a desired value and realizes power saving in the transmission apparatus 10, while handling multiband wireless communication. That is, the signal generation control unit 16 implements 2 output power control operations: control of discrete output power by selecting the power amplifiers 11 to be operated, and control of continuous power ratio for each band, in accordance with the output power ratio of each band. In this way, the signal generation control unit 16 has a configuration that includes a first control unit and a second control unit.

The signal generation control unit 16 associates control regarding ON/OFF states of the respective switches 12, with binary code. For example, in FIG. 2, a case may be considered where the number of power amplifiers 11 and switches 12 is 3 (n=3), and ON/OFF states of the switches 12 are controlled using 3 digit binary code (000 to 111). In this case, the LSB of the binary code is made to correspond to switch 12-1 (the LSB is carried by the power amplifier 11-1), and an MSB is made to correspond to switch 12-3. On that basis, in a case where switch 12-1 is turned ON, "001" is set to the binary code, and the ON state of the switch 12-1 is controlled and managed. It is to be noted that the signal generation control unit 16 may output RF signals to a power amplifier 11 that is in an ON state, among the power amplifiers 11, and not output RF signals to the power amplifier 11 that is in an OFF state.

The signal generation control unit 16 is provided with gain or attenuator to modulate the amplitude of RF signals for each band, in each power amplifier 11, and individually varies output voltage (output power) of the RF signals.

Figure 3:
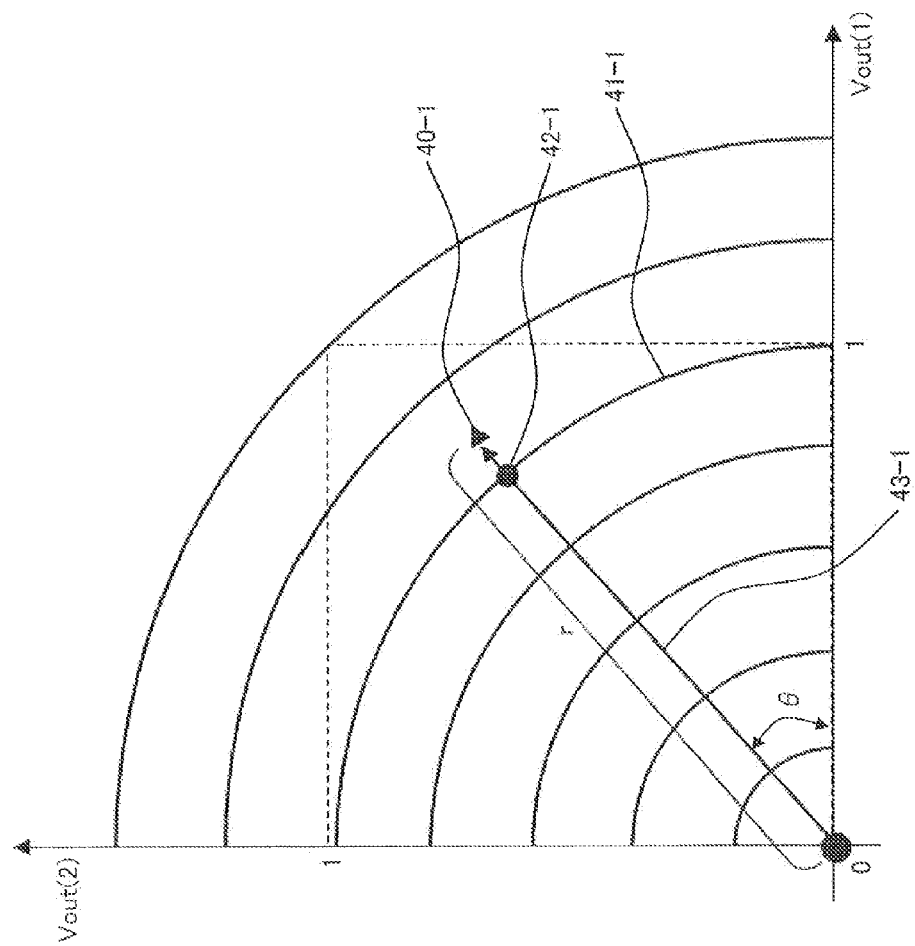
FIG. 3 is a diagram for describing control when output power of the transmission apparatus 10 is determined.

A case where the number of bands is 2 may be considered, for example, in output power control of the signal generation control unit 16. A combination of load voltage Vout(1) in band 1 and load voltage Vout(2) in band 2 with regard to the load 15 of the transmission apparatus 10 is quantized on a plurality of circles shown in FIG. 3. It is to be noted that maximum values of the load voltages Vout(1) and Vout(2) displayed in FIG. 3 are standardized with reference to 1. FIG. 3 shows, as an example, a case of quantizing with a binary code of 3 bits, that is, a case where amplitude range is divided into 8 ($2^3$=8)

The circles shown in FIG. 3 represent states in which the total power output of each band respectively is held at a constant value, while changing the output power ratio of each band. For example, the intersection of circle 41-1 and the horizontal axis of FIG. 3 means that the load voltage Vout(2) in band 2 is not outputted. Or, the intersection point 42-1 of the circle 41-1 and a straight line 43-1 where the angle θ in FIG. 3 is 45° means that the output power of the RF signals in band 1 and the output power of the RF signals in band 2 match (output power ratio is 0.5).

The presence of a plurality of circles in FIG. 3, indicates that the total power output in the respective bands have a plurality of discrete values. That is, in FIG. 3, this means that the larger the radius of the respective circles, the more the total power output in the respective bands increase.

In FIG. 3, for example, a case is considered where the target value of the output power ratio of respective bands and total power output of combined RF signals in band 1 and band 2 is target point 40-1. In this case, a combination of load voltages (Vout(1), Vout(2)) represented by an intersection point 42-1 which is the intersection of the circle 41-1 closest to the target point 40-1, and a straight line 43-1 linking the origin and the target point 40-1, is outputted from the transmission apparatus 10.

At this time, the signal generation control unit 16 controls the ON/OFF state of the switch 12 realizing the circle 41-1 in FIG. 3. More specifically, since the circle 41-1 in FIG. 3 can be realized with binary code "101=5", control is performed so that switch 12-1 and switch 12-3 are ON and switch 12-2 is OFF.

In a power amplifier 11-i, when the sum of output power of RF signal 20-i in band 1 and output power of RF signal 21-i in band 2 reaches the saturated output power of the power amplifier 11-i, the power amplifier 11-i is in a saturated state. That is, when the total output power in the respective bands reaches a characteristic constant value (saturated output power) of the power amplifier 11, the power amplifier 11 is in a saturated state. Therefore, in each of the power amplifiers 11 being operated, by changing the power ratio of RF signals for each band while keeping the total power of RF signals received in the respective bands at a constant value (saturated output power), it is possible to operate the power amplifiers in a saturated state at which a high power efficiency is obtained, and to continuously change the output power in the respective bands. The signal generation control unit 16 performs the second control operation of changing the power ratio of RF signals in each band, in each of the power amplifiers 11 selected, in accordance with the power ratio of transmitted RF signals in respective bands, while keeping the total power of RF signals received at a constant value (saturated output power) in each of the power amplifiers 11 selected by the first control operation. As described above, for example, if the angle θ shown in FIG. 3 is 45°, the amplitude of the RF signals outputted to the power amplifier 11 is controlled so that the output power of the RF signals arranged in band 1 and the output power of the RF signals arranged in band 2 are equal. It is to be noted that, with reference to FIG. 3, this type of second control operation in the signal generation control unit 16 is equivalent to setting the power of RF signals of respective bands, received by the respective power amplifiers 11, in accordance with the angle θ.

Here in the transmission apparatus 10, load impedance seen from an output terminal of the respective power amplifiers 11 is changed according to ON/OFF state of other power amplifiers 11. Since there is a possibility that the change in load impedance will deteriorate the power efficiency of the respective power amplifiers 11, it is desirable to change the load impedance seen from one of the power amplifiers 11 among the respective power amplifiers 11, in order that power efficiency does not deteriorate even if the ON/OFF state of another power amplifier 11 is switched. Therefore, the signal generation control unit 16 performs control so that the output power ratios in the respective bands outputted by the respective power amplifiers 11 are aligned in each of the power amplifiers 11. That is, the signal generation control unit 16 performs control to change the power ratios of the RF signals in the respective bands, so that the output power ratios in the respective bands outputted by the respective selected power amplifiers 11 are equal in each of the power amplifiers 11.

In this way, the transmission apparatus 10 switches the circle at which the intersection point 42-1 is present, which is a combination of load voltages (Vout(1), Vout(2)) outputted by the transmission apparatus 10, by selecting power amplifiers 11 to be operated from the plurality of power amplifiers 11. By switching the circle on which the intersection point 42-1 is present, the size of the total power output of the transmitted RF signals is controlled (the first control operation is implemented). By continuously changing the output power ratio of the RF signals for the respective bands while maintaining a saturation state in each of the power amplifiers 11, the output ratio of the RF signals in the respective bands is controlled (the second control operation is implemented).

That is, operations of the signal generation control unit 16 described using FIG. 3 may be described as selecting power amplifiers 11 to be operated from the plurality of power amplifiers 11 based on the radius r, and continuously changing the output power ratio of the RF signals in each band, based on the angle θ.

Figure 4:
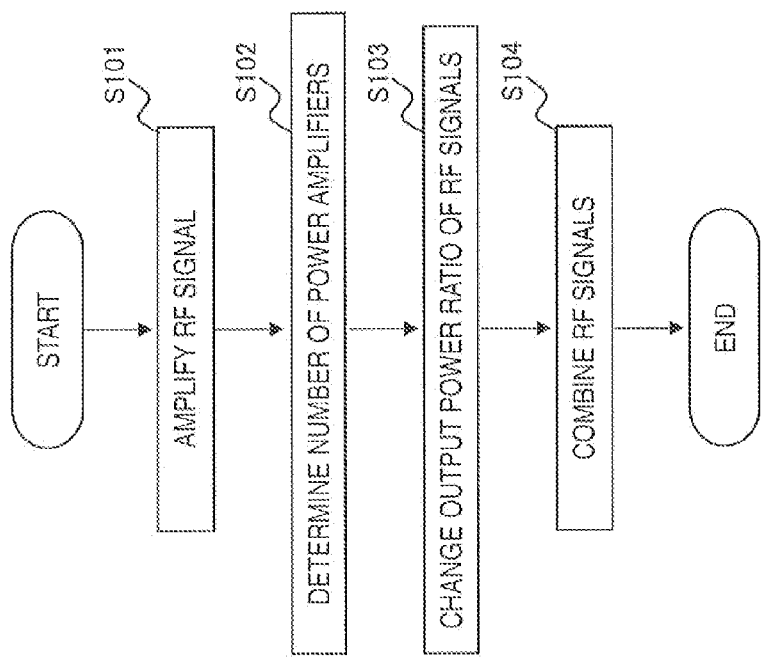
FIG. 4 is a flowchart showing an example of operations of the transmission apparatus 10.

Here, the operations of the transmission apparatus 10 described above can be outlined as in the flowchart shown in FIG. 4.

Referring to FIG. 4, the transmission apparatus 10 executes a transmission method of transmitting the RF signals that have been amplified by the power amplifiers 11. The transmission apparatus 10 amplifies the RF signals arranged in at least 2 bands, in the plurality of power amplifiers 11 (step S101). In addition, the transmission apparatus 10 executes the first control operation of selecting power amplifiers 11 that perform amplification operations, among the plurality of power amplifiers 11, in accordance with the total power of the transmitted RF signals (step S102). Thereafter, the transmission apparatus 10 executes a second control operation of changing the power ratio of RF signals in respective bands, while keeping constant the total power of RF signals received, in each of the selected power amplifiers 11, in accordance with the power ratio of transmitted RF signals in respective bands (step S103). Thereafter, the transmission apparatus 10 combines the RF signals outputted by the selected power amplifiers 11, using transformer elements 13 (step S104). It is to be noted that the transmission method according to the flowchart shown in FIG. 4 is exemplary, and there is no intention to limit the order of the executed processes. For example, the order of the first control operation (step S102) and the second control operation (step S103) may be switched. Or, step S101 may be executed after step S103.

Figure 5:
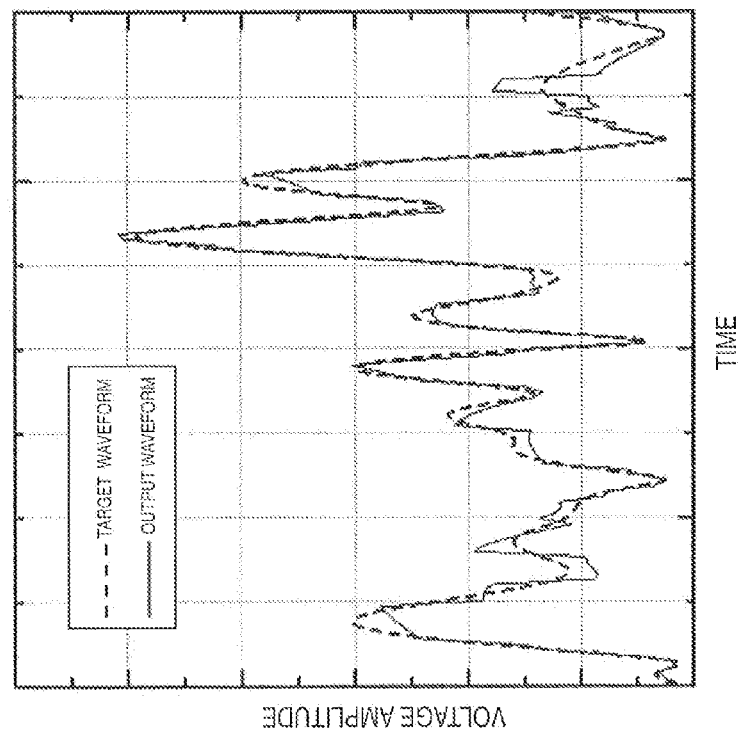
FIG. 5 is a diagram showing an example of a voltage amplitude waveform of band 1, outputted to a load 15 of the transmission apparatus 10.

FIG. 5 is a diagram showing an example of a voltage amplitude waveform of a band 1 (carrier frequency f1) outputted to the load 15 of the transmission apparatus 10. It is to be noted that the solid line in FIG. 5 indicates a voltage amplitude waveform of the transmission apparatus 10, and the broken line indicates a voltage amplitude waveform with no error (target waveform). In the transmission apparatus 10, since 2-dimensional quantization shown in FIG. 3 (output is limited to discrete circles) is implemented, quantization error occurs with regard to the target waveform in the output waveform shown in FIG. 5. It is to be noted that in FIG. 5, the transmission signal uses WCDMA-DL (Wideband Code Division Multiple Access-Down Link).

Results of FIG. 5 are obtained under the following conditions.

device sizes of the respective power amplifiers 11 have ratios of $2^0:2^1:\ldots:2^{N-1}$ voltage amplitudes outputted from the secondary side of the transformer elements 13 when the power amplifiers 11 are operated have ratios of $2^0:2^1:\ldots:2^{N-1}$ control of transmission power according to ON/OFF states of the power amplifiers 11 is performed using binary code sampling rate when ON/OFF state of the power amplifiers 11 is controlled is 30.72 MHz It is to be noted that the number n of power amplifiers 11 and transformer elements 13 is equal to the number of bits of binary code used in control of the transmission apparatus 10, and in FIG. 3, "n=3".

Referring to FIG. 5, although quantization error is present, the transmission apparatus 10 can obtain a voltage waveform close to a desired amplitude.

Figure 6:
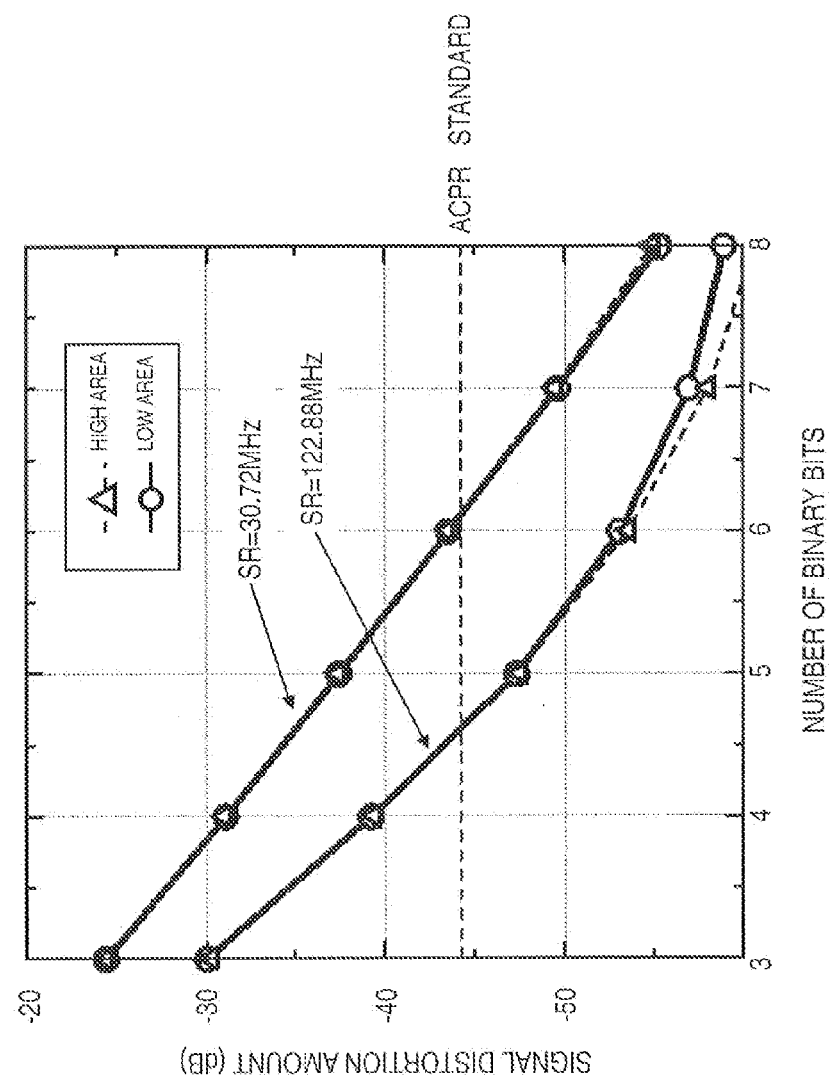
FIG. 6 is a diagram showing the number n of power amplifiers 11 being operated and signal distortion amount of band 1 outputted to the load 15, in a case of transmitting a WCDMA (registered trademark)-DL signal in band 1.
Figure 7:
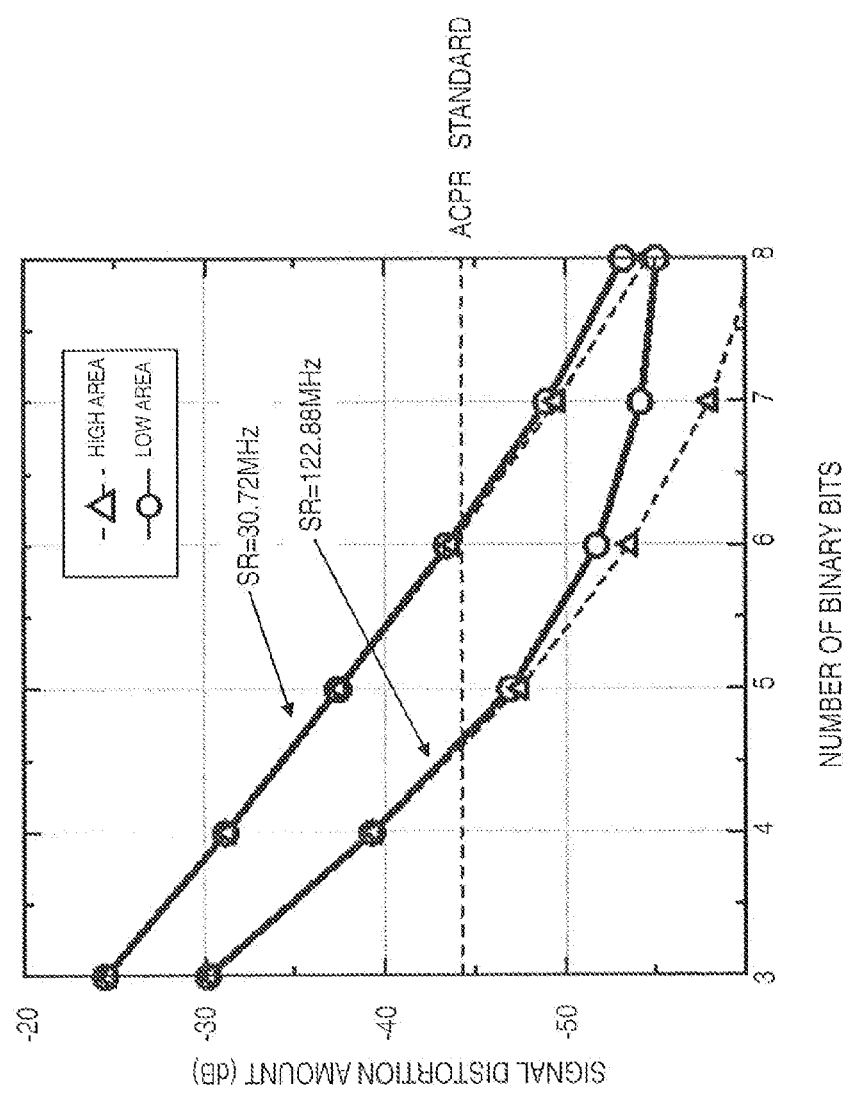
FIG. 7 is a diagram showing the number n of power amplifiers 11 being operated and signal distortion amount in band 2 outputted to the load 15, in a case of transmitting a WCDMA-DL signal in band 2.

FIG. 6 is a diagram showing the number n of power amplifiers 11 to be operated, and signal distortion amount (ACPR: Adjacent Channel Power Ratio) in band 1 outputted to the load 15, in a case of transmitting a WCDMA-DL signal in band 1. FIG. 7 is a diagram showing the number n of power amplifiers 11 to be operated, and signal distortion amount (ACPR) in band 2 outputted to the load 15, in a case of transmitting a WCDMA-DL signal in band 2. It is to be noted that the number n of power amplifiers 11 matches the number of bits of the binary code used by the signal generation control unit 16.

Results of FIG. 6 and FIG. 7 are obtained under the following conditions.

device sizes of the respective power amplifiers 11 have ratios of $2^0:2^1:\ldots:2^{N-1}$ voltage amplitudes outputted from the secondary side of transformer elements 13 when power amplifiers 11 are operated have ratios of $2^0:2^1:\ldots:2^{N-1}$ control of transmission power according to ON/OFF states of the power amplifiers 11 is performed using binary code sampling rate (SR) when the ON/OFF state of a power amplifier 11 is controlled has 2 types: 30.72 MHz and 122.88 MHz calculation of the signal distortion amount is carried out in a high region side of a band (dotted line with triangles thereon in FIG. 6 and FIG. 7) and a low region side of a band (solid line with circles thereon in FIG. 6 and FIG. 7)

Referring to FIG. 6 and FIG. 7, it is understood that the transmission apparatus 10 has approximately the same signal distortion amount in the 2 bands.

Comparative Example

Next, a description is given concerning a comparative example, comparing with the transmission apparatus 10 according to the first exemplary embodiment.

Figure 8:
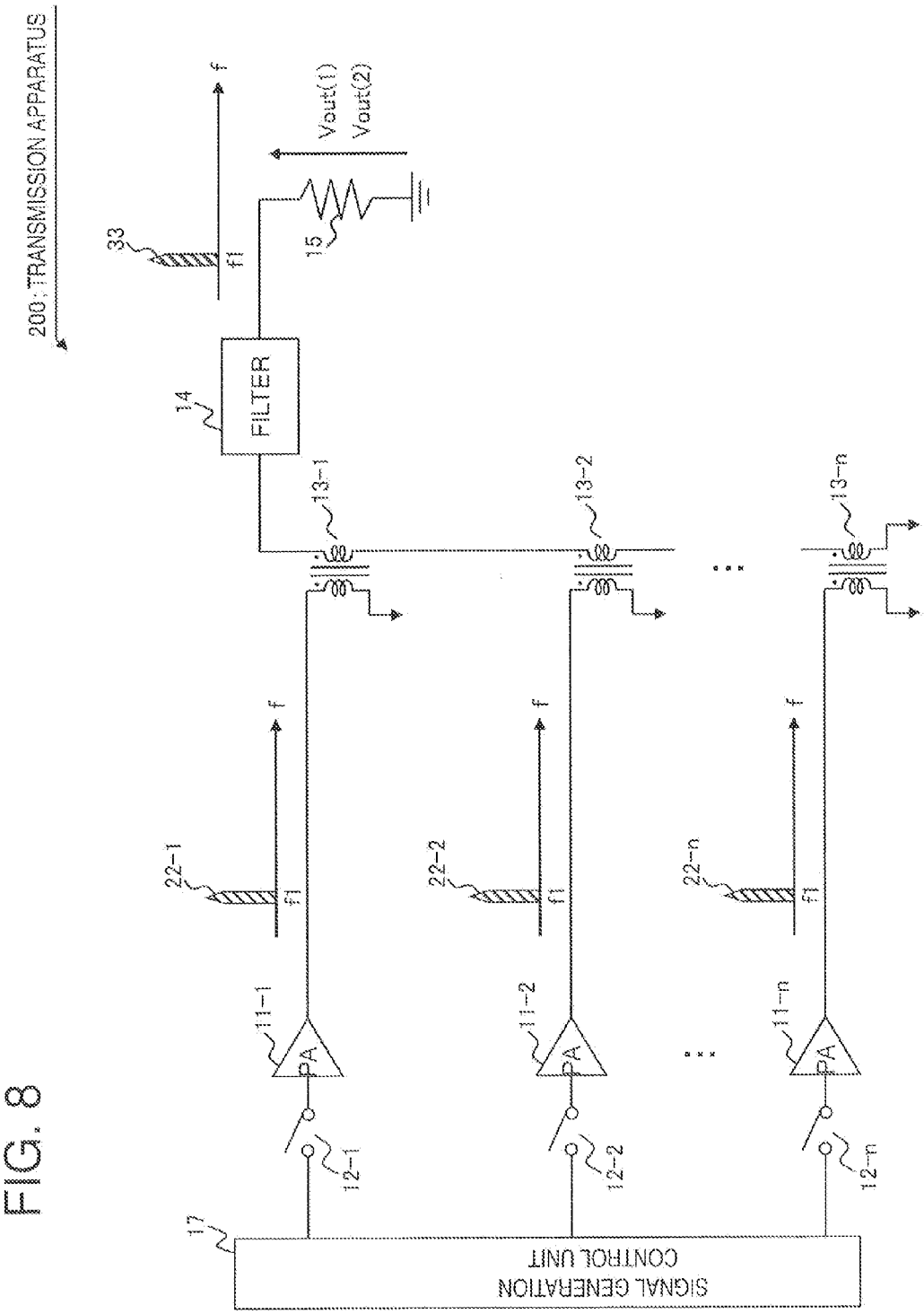
FIG. 8 is a diagram showing an example of a circuit configuration of a transmission apparatus 200, which digitally controls transmission power of a power amplifier.

FIG. 8 is a diagram showing an example of a circuit configuration of a transmission apparatus 200 that digitally controls transmission power of a power amplifier. A point of difference between the transmission apparatus 10 shown in FIG. 2 and the transmission apparatus 200 is that a signal generation control unit 17 does not handle multiband communication.

The transmission apparatus 200 controls output power to a load 15 by selecting power amplifiers 11 to be operated from among a plurality of power amplifiers 11. Output power Pout, which is outputted to the load 15, is given by the following expression (1)

$$P\text{out}=\alpha 1 P\text{sat}(1)+\ldots+\alpha N P\text{sat}(n) \qquad (1)$$

It is to be noted that Psat(i) is saturated output of a power amplifier 11-$i$. Coefficient $\alpha(i)$ is set as "$\alpha(i)=1$" when the power amplifier 11-$i$ is operated, and is set as "$\alpha(i)=0$" when the power amplifier 11-$i$ is turned OFF and power is not outputted.

The signal generation control unit 17 of the transmission apparatus 200 determines a setting of the coefficient $\alpha(i)$ such that the output power Pout shown in expression (1) has a desired value (such that it approaches a desired value). In other words, the signal generation control unit 17 controls the ON/OFF state of the power amplifier 11 such that the output power Pout has a desired value. An RF signal having an amplitude where each of the respective power amplifiers 11 is operated at saturation level, is outputted from the signal generation control unit 17, the output being to the respective power amplifiers 11. It is to be noted that instead of performing ON/OFF control of a plurality of switches 12, the power amplifiers 11 may be controlled by output/non-output of RF signals from the signal generation control unit 17.

In the transmission apparatus 200, each of the power amplifiers 11 is operated at saturated output at which high power efficiency is constantly obtained, or is controlled to an OFF state without power being consumed so that power saving can be realized.

Here, load impedance seen from an output terminal of each of the power amplifiers 11 is changed according to the ON/OFF state of other power amplifiers 11. As in the transmission apparatus 200 shown in FIG. 8, in a case where output of the respective power amplifiers 11 is serially combined using transformer elements 13, the load impedance seen from one of the plurality of power amplifiers 11 is changed in order that power efficiency does not deteriorate even if the ON/OFF state of another power amplifier 11 is switched. Therefore, the transmission apparatus 200 shown in FIG. 8 is advantageous from the viewpoint of power saving.

It is to be noted that in the transmission apparatus 200, the output power Pout has the form of discrete values generated by the plurality of power amplifiers 11. Accordingly, quantization error occurs between desired output power values and the actual output power Pout.

Figure 9:
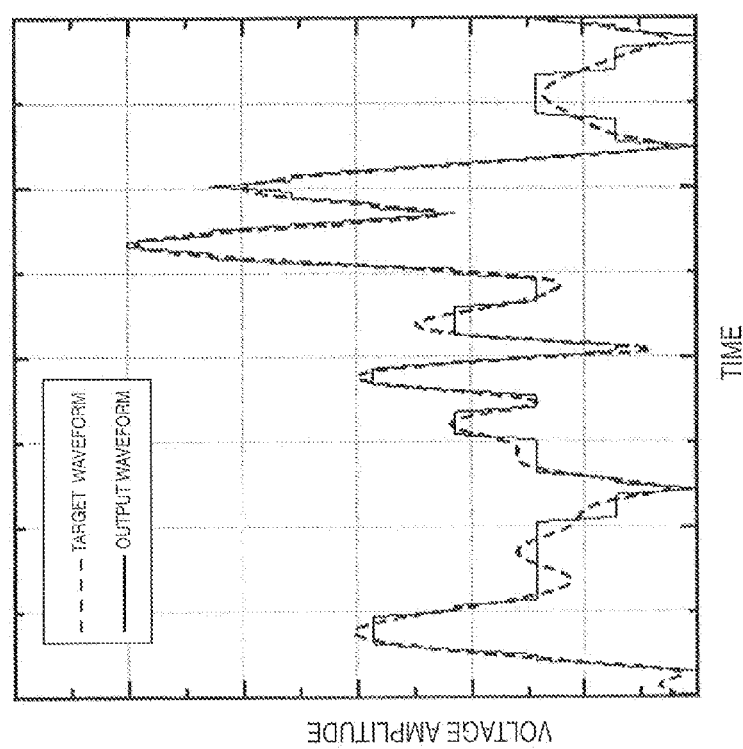
FIG. 9 is a diagram showing an example of a voltage amplitude waveform outputted to a load 15 of the transmission apparatus 200.

FIG. 9 is a diagram showing an example of a voltage amplitude waveform outputted to a load 15 of the transmission apparatus 200. FIG. 9 shows voltage amplitude waveform with no error (target waveform), similar to FIG. 5. Referring to FIG. 9, since the voltage amplitude waveform of the transmission apparatus 200 only takes discrete fixed values, quantization error occurs with respect to the target waveform. It is to be noted that conditions when the voltage amplitude waveform shown in FIG. 9 is obtained are identical to conditions when the voltage amplitude waveform shown in FIG. 5 is obtained.

A technique of increasing the number of power amplifiers may be considered as a method for reducing the effect of quantization error. By increasing the number of power amplifiers, the dynamic range of output signals is enlarged and it is possible to reduce the effect of quantization error.

Figure 10:
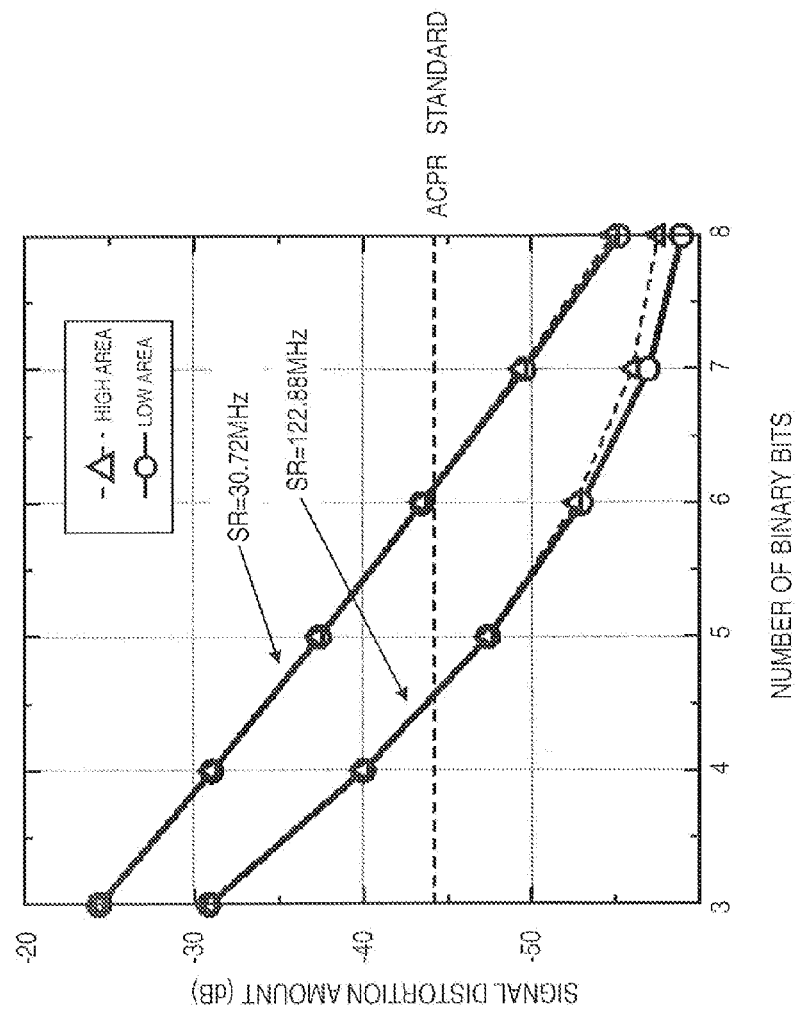
FIG. 10 is a diagram showing the number n of power amplifiers 11 being operated and signal distortion amount of a signal outputted to the load 15, in a case of transmitting a WCDMA-DL signal, in the transmission apparatus 200.

FIG. 10 is a diagram showing the number n of power amplifiers 11 to be operated and signal distortion amount (ACPR) of signals outputted to the load 15, in a case of transmitting a WCDMA-DL signal. It is to be noted that conditions when the signal distortion amount shown in FIG. 10 is obtained are identical to conditions when the signal distortion amount shown in FIG. 6 and FIG. 7 is obtained. Referring to FIG. 10, it may be understood that the signal distortion amount (ACPR) is reduced by increasing the number (number of binary bits) of the power amplifiers 11.

The signal distortion amount can be reduced also by increasing sampling rate controlling the ON/OFF state of the power amplifiers 11. Referring to FIG. 10, in a case of having the sampling rate for controlling turning the power amplifiers 11 ON/OFF at 30.72 MHz, to satisfy the standard amount (ACPR<−44.2 dBc) of signal distortion in WCDMA-DL, the number of power amplifiers 11 (number of binary bits) must be at least 7. Meanwhile, in a case where the sampling rate is 122.88 MHz, it may be understood that to satisfy the standard amount of signal distortion in WCDMA-DL, it is sufficient if the number of power amplifiers 11 is at least 5.

Note that a description is given regarding techniques of reducing quantization error as disclosed in Patent Literature 1, Patent Literature 2 and Non-Patent Literature 1, assuming a case where a power amplifier 11-1 carries LSB. This case corresponds to control where, in expression (1), coefficient $\alpha(1)$ has continuous values from 0 to 1, and other coefficients $\alpha(i)$ with the exception of coefficient $\alpha(1)$ have discrete values of 0 or 1. However, with this method of continuously (analogically) controlling output power of the power amplifiers 11, there is a problem in that, while it is possible to correct quantization error, the power consumption of the power amplifiers performing analog operations increases.

Next, an outline is given concerning a transmission apparatus disclosed in Non-Patent Literature 2.

Figure 11:
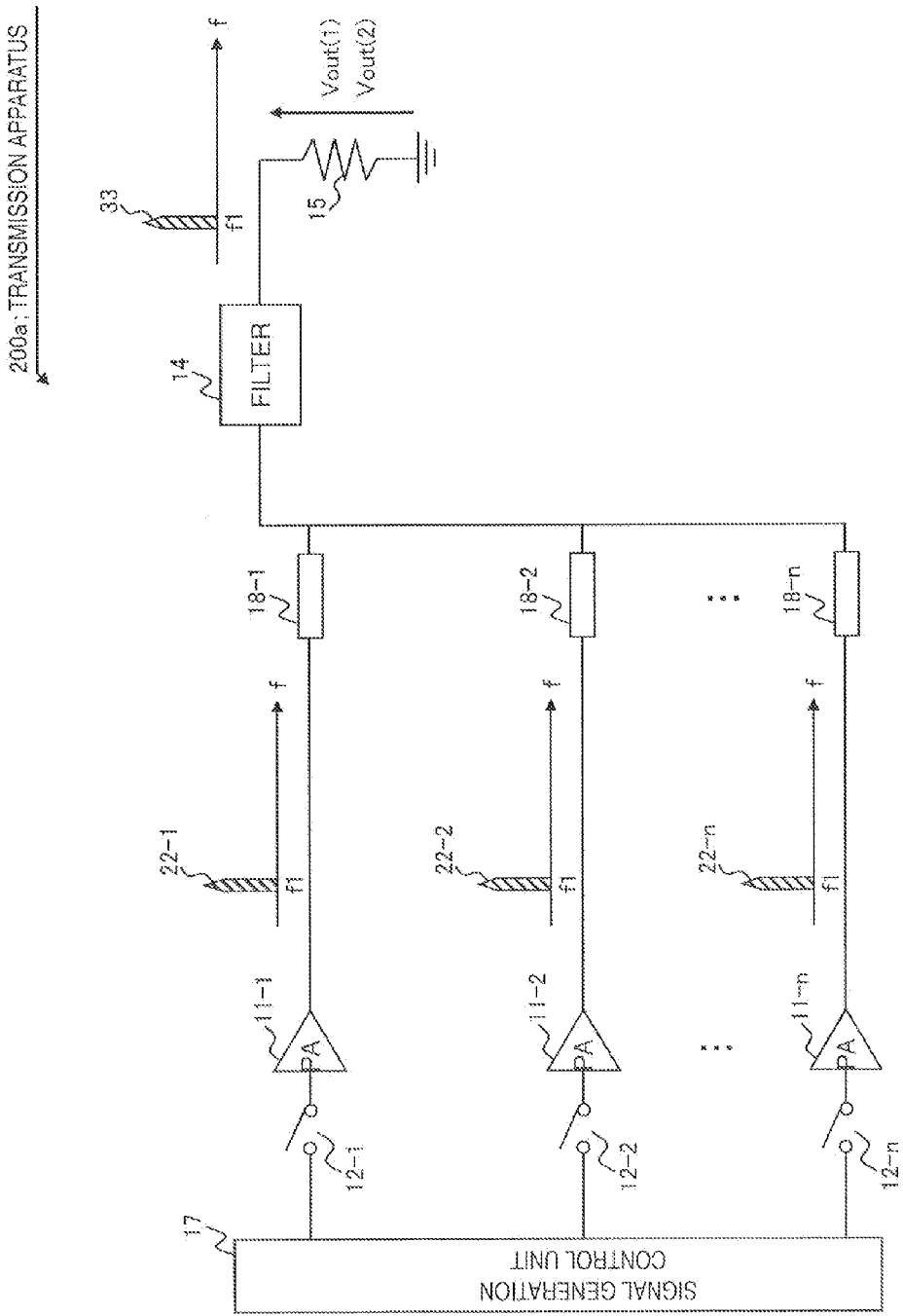
FIG. 11 is a diagram showing an example of a circuit configuration of a transmission apparatus 200a, which digitally controls transmission power of a power amplifier.

FIG. 11 is a diagram showing an example of a circuit configuration of a transmission apparatus 200a that digitally controls transmission power of power amplifiers. A point of difference between the transmission apparatus 200 and the transmission apparatus 200a is that output of the amplifiers 11 is combined using $\lambda/4$ lines 18-1 to 18-n, instead of transformer elements 13-1 to 13-n. In the transmission apparatus 200, output of the plurality of power amplifiers 11 is serially combined by the transformer elements 13, but in the transmission apparatus 200a output of the plurality of power amplifiers 11 is combined in parallel by the $\lambda/4$ lines 18. Outside of this point of difference, the transmission apparatus 200 and the transmission apparatus 200a perform the same operations.

In the transmission apparatus 200a shown in FIG. 11 also, similar to the transmission apparatus 200 the load impedance seen from one of the power amplifiers 11 is changed in order that power efficiency does not deteriorate even if the ON/OFF state of another power amplifier 11 is switched.

Figure 20:
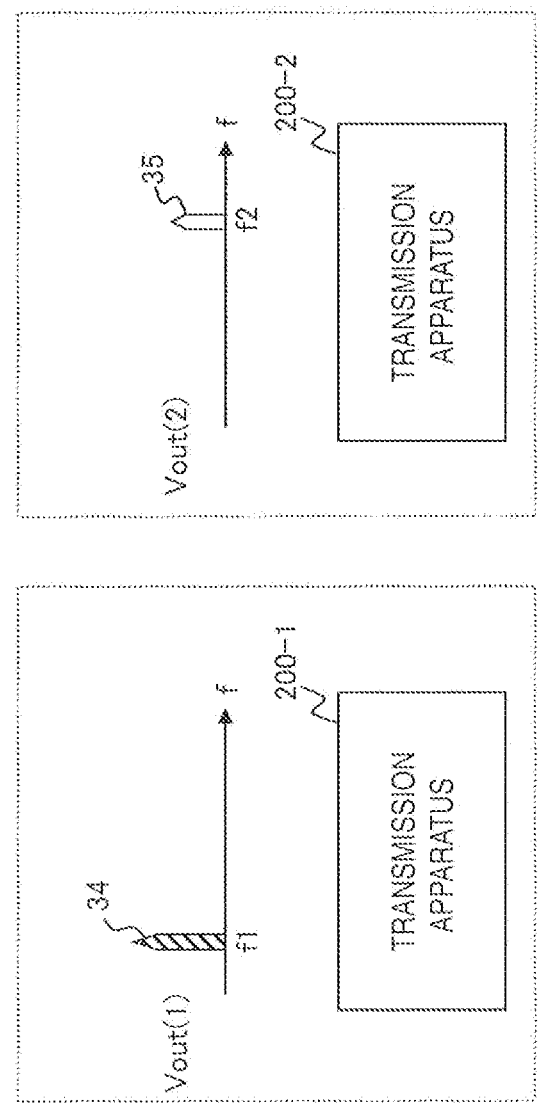
FIG. 20 is a diagram showing an example of a transmission apparatus applicable to multiband using 2 transmission apparatuses.

Next, a description is given concerning multiband communication using the transmission apparatus 200 or the transmission apparatus 200a. As described above, the transmission apparatus shown in FIG. 20 realizes multiband communication by using 2 of the transmission apparatuses 200. A transmission apparatus 200-1 transmits an RF signal 34 in band 1 (carrier frequency f1). A transmission apparatus 200-2 transmits an RF signal 35 in band 2 (carrier frequency f2). As shown in FIG. 20, application to a dual band (2 band transmission) is possible by providing the 2 transmission apparatuses 200-1 and 200-2.

Figure 21:
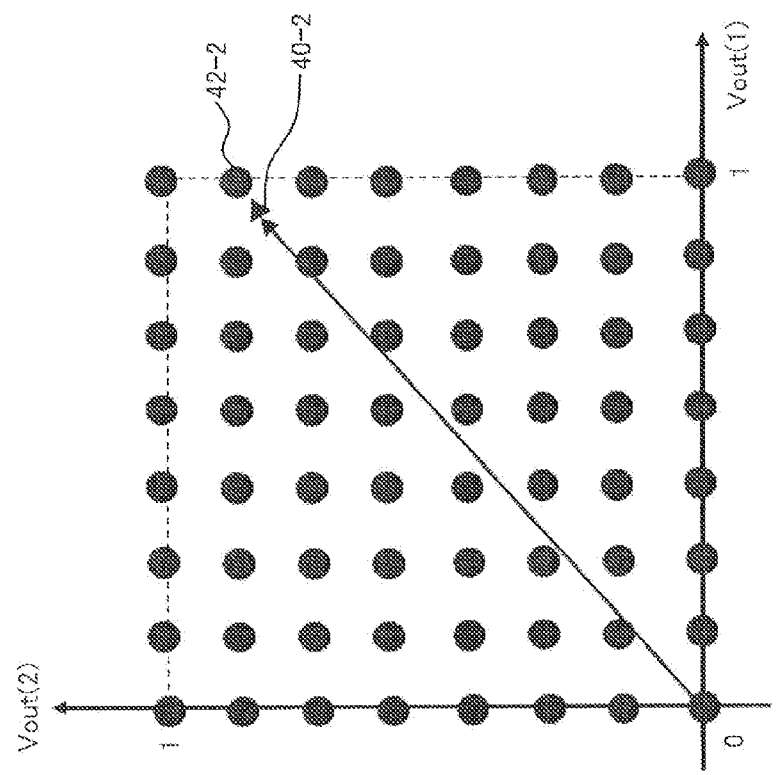
FIG. 21 is a diagram for describing control the transmission apparatus shown in FIG. 20.

In the transmission apparatus handling multiband shown in FIG. 20, a combination of load voltage Vout(1) in band 1 for load 15 of the transmission apparatus 200-1 and load voltage Vout(2) in band 2 for load 15 of the transmission apparatus 200-2 is quantized at discrete points shown in FIG. 21. It is to be noted that the maximum values of the load voltages Vout(1) and Vout(2) in FIG. 21 are shown as being standardized to 1. FIG. 21 shows as an example a case of quantizing with a 3 bit binary code, that is, a case where amplitude range is divided into 8 ($2^3=8$)

In each of the transmission apparatuses 200-1 and 200-2, by selecting power amplifiers 11 to be operated from among the power amplifiers 11, the load voltage combination (Vout (1) and Vout(2)) is selected as the closest to target point among discrete points shown in FIG. 21, and outputted. For example, in FIG. 21 the combination of load voltages (Vout(1), Vout(2)), represented by a discrete point 42-2 which is the discrete point closest to the target point 40-2, is outputted from the transmission apparatuses 200-1 and 200-2. In a case of outputting a signal at discrete point 42-2, since Vout(1) is at maximum amplitude (=1), all the power amplifiers 11 included in the transmission apparatus 200-1 that transmits signals in band 1 are in an ON state. Similarly, in a case of outputting a signal at discrete point 42-2, since Vout(2) is lower than the maximum amplitude by 1 quantized interval, from the power amplifier 11 of the transmission apparatus 200-2 that transmits signals in band 2, only the power amplifier 11 carrying LSB is OFF, and the other power amplifiers 11 are ON.

In FIG. 20, multiband communication can be realized using the transmission apparatus 200a instead of the transmission apparatus 200.

As described above, it is possible to realize multiband communication using 2 of the transmission apparatuses 200. However, making the communication multiband in this way is problematic as described above, in that the required number of power amplifiers 11 and transformer elements 13 increases.

Next, a comparison is made concerning quantization error of the transmission apparatus 200 and the transmission apparatus 10 according to the first exemplary embodiment.

Comparing FIG. 5 that shows a voltage amplitude waveform of the transmission apparatus 10 and FIG. 9 that shows a voltage amplitude waveform of the transmission apparatus 200, it may be understood that nearly the same quantization error occurs in the transmission apparatus 10 and the transmission apparatus 200. In other words, even with multiband communication being handled, performance with regard to quantization error of transmission apparatus 10 is not inferior with respect to the transmission apparatus 200.

In multiband communication using 2 of the transmission apparatuses 200, there is a problem in that the number of apparatuses and output combining elements (for example, transformer elements 13) increases in proportion to the number of bands. On the other hand, in the transmission apparatus 10 according to the first exemplary embodiment, the number of output combining elements (for example, transformer elements 13) does not increase even if the number of bands increases.

In addition, FIG. 6 and FIG. 7 indicate that, with regard to the transmission apparatus 10, if the sampling rate of the power amplifiers 11 is taken as 122.88 MHz, in order to satisfy the standard amount (ACPR<−44.2 dBc) of signal distortion in WCDMA-DL in both band 1 and band 2, the required number n of power amplifiers 11 must be at least 5. That is, FIG. 6 and FIG. 7 indicate that if one transmission apparatus 10 including 5 of the power amplifiers 11 is used, multiband communication using 2 bands is possible.

FIG. 10, which shows a characteristic related to signal distortion of the transmission apparatus 200, indicates that if the sampling rate of the power amplifiers 11 is taken as 122.88 MHz, in order to satisfy the standard amount (ACPR<−44.2 dBc) of signal distortion in WCDMA-DL in 1 band, the number n of power amplifiers 11 must be at least 5. In a case where the required number n of power amplifiers 11 is the same but 2 bands are handled, since 2 of the transmission apparatuses 200 must be provided, the required number of power amplifiers 11 must be double n=5, that is, 10 or more. In addition, the number of transformer elements 13 also increases in proportion to the number of bands.

As described above, in the transmission apparatus 10 according to the first exemplary embodiment, when multiband communication is handled, quantization error is curbed to a desired value or less, and along with realizing power saving, it is possible to reduce the required number of power amplifiers and output combining elements. This is advantageous in that, in a case of implementing output combining elements as discrete parts, it is possible to curb increase in apparatus size when multiband is realized. In a case of implementing output combining elements on an IC, it is possible to curb increase in cost and area of the IC when multiband is realized.

Next, a description is given concerning a modified example of the transmission apparatus 10 according to the first exemplary embodiment.

First Modified Example

Figure 12:
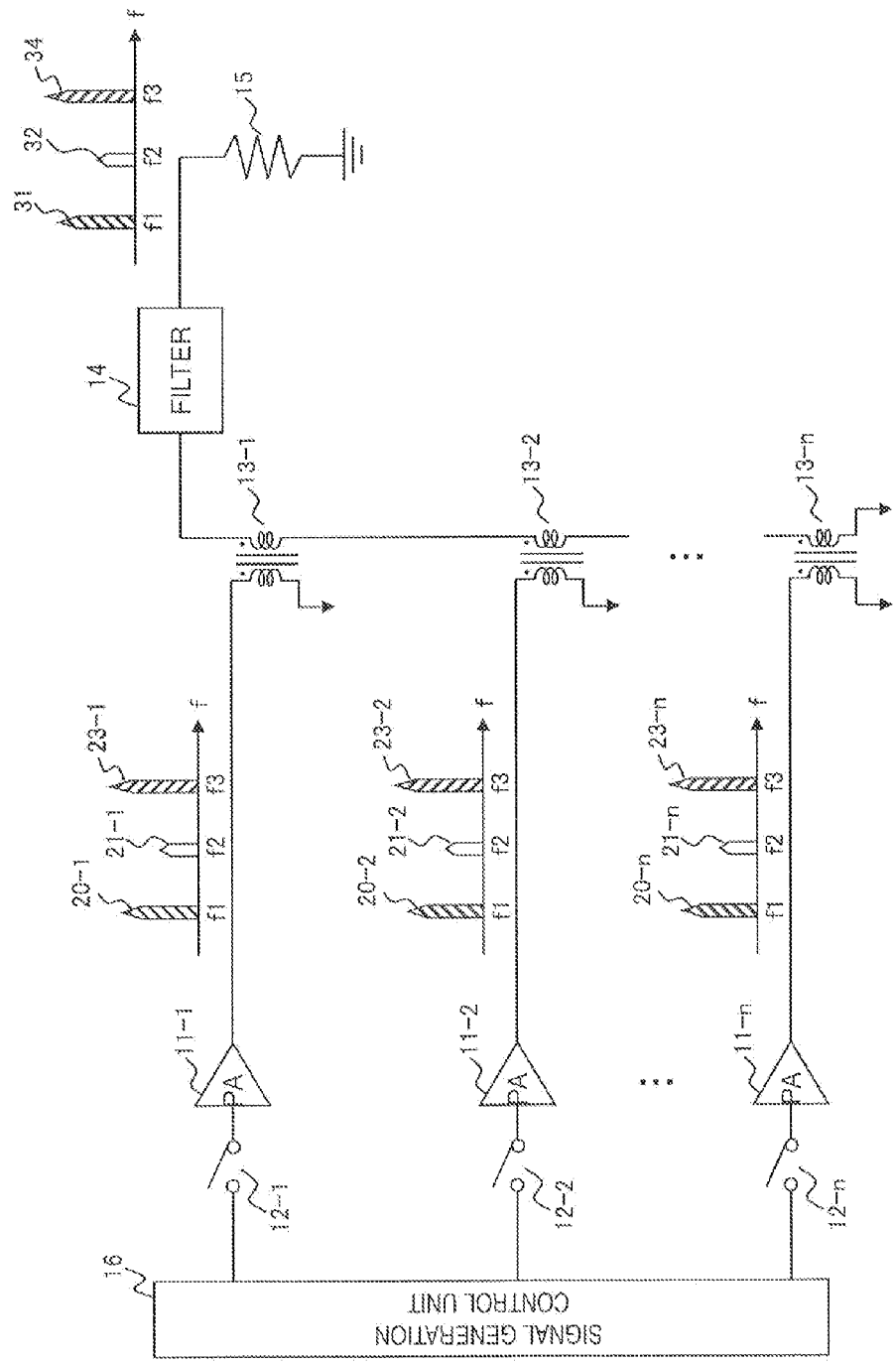
FIG. 12 is a diagram showing an example of a circuit configuration of a transmission apparatus 10a according to a first modified example of the first exemplary embodiment.

FIG. 12 is a diagram showing an example of a circuit configuration of a transmission apparatus 10a. The transmission apparatus 10a handles transmission of signals in 3 bands. In the transmission apparatus 10 and the transmission apparatus 10a, the number of RF signals received by the respective power amplifiers 11 differs.

As shown in FIG. 12, in the transmission apparatus 10a, by RF signals in 3 bands being received by the respective power amplifiers 11, multiband communication is realized. Referring to FIG. 12, RF signals 20-$i$, 21-$i$ and 23-$i$ outputted from the respective power amplifiers 11-$i$ are combined for respective carrier frequencies in the transformer elements 13, and are outputted to the load 15 via a filter 14.

The transformer elements are normally provided with broadband characteristics, and it is easy to combine a plurality of RF signals distributed in a wide frequency range. The transmission apparatus 10a shown in FIG. 12 implements 2 forms of output power control: control of discrete output power by selecting power amplifiers 11 to be operated, and control of continuous output power by changing the output power ratio in each band. As a result, similar to the transmission apparatus 10, it is possible to curb increase in the number of transformer elements 13 when multiband is realized.

Second Modified Example

Figure 13:
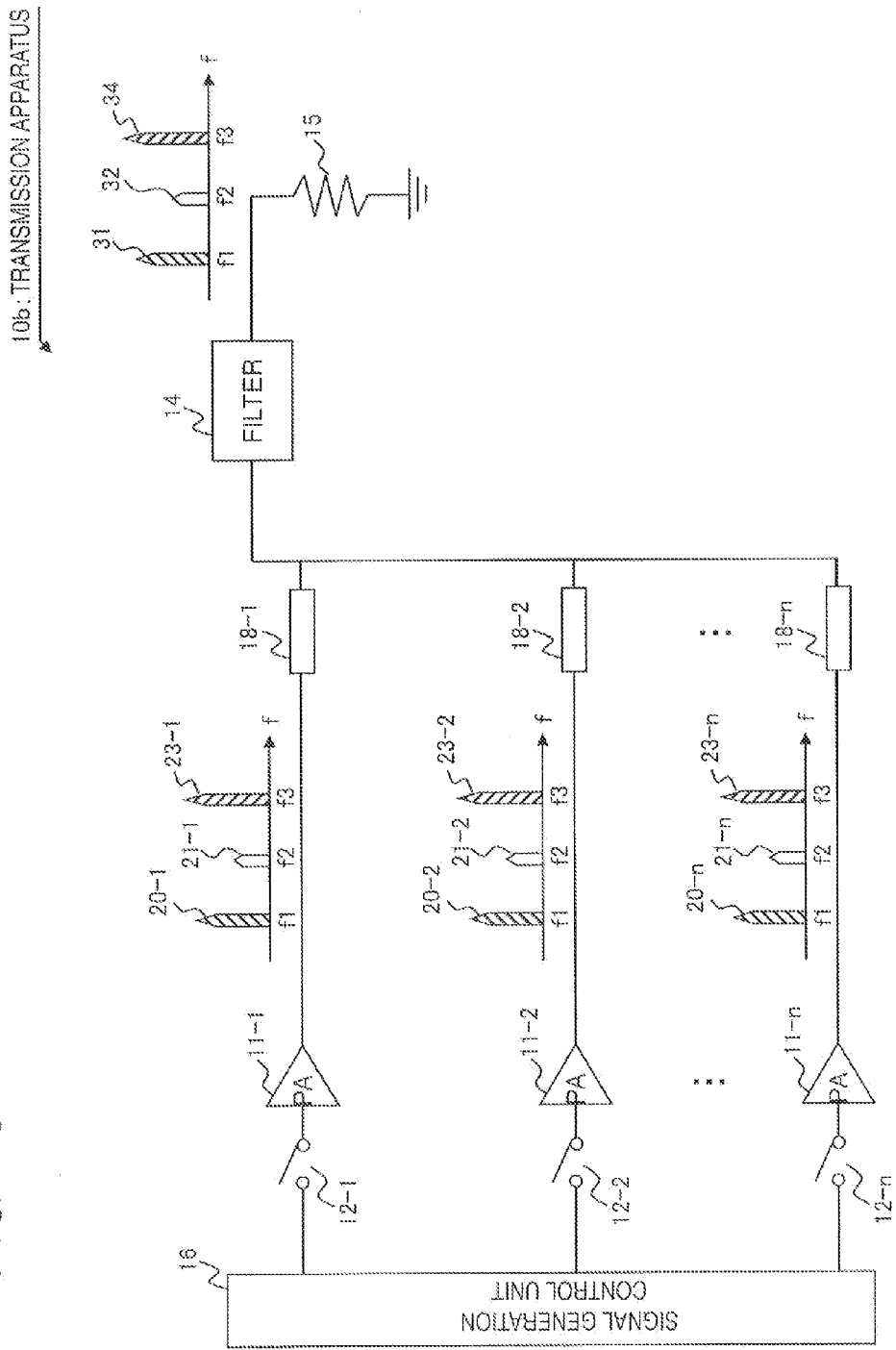
FIG. 13 is a diagram showing an example of a circuit configuration of a transmission apparatus 10b according to a second modified example of the first exemplary embodiment.

FIG. 13 is a diagram showing an example of a circuit configuration of a transmission apparatus 10b. In the transmission apparatus 10 and the transmission apparatus 10b, $\lambda/4$ lines 18 are used instead of the transformer elements 13. That is, the transmission apparatus 10b is provided with a combining unit formed of a plurality of transmission line elements ($\lambda/4$ lines), and the number of plurality of the transmission line elements and the number of the plurality of the power amplifiers 11 are same. One end of a $\lambda/4$ line 18 is connected with a corresponding power amplifier 11, and the other ends of plural $\lambda/4$ lines are connected in parallel.

As in the transmission apparatus 10b shown in FIG. 13, even with the $\lambda/4$ lines 18 being used instead of the transformer elements 13, by implementing the same control as the transmission apparatus 10, it is possible to curb an increase in the number of output combining elements when multiband is realized.

Here, the $\lambda/4$ lines 18 that are included in the transmission apparatus 10b are required to handle a plurality of bands for transmission. However, unlike transformer elements where broadband characteristics are obtained, the bands of the $\lambda/4$ lines are normally narrow. Making the $\lambda/4$ lines 18 handle a plurality of bands can be realized according to the description below.

Figure 14:
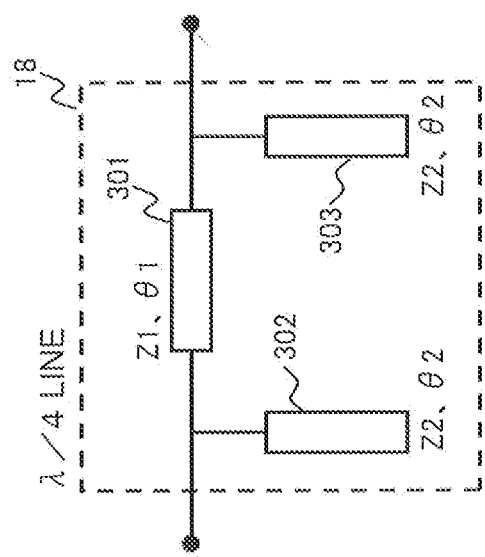
FIG. 14 is a diagram showing an example of a circuit configuration of a $\lambda/4$ line.
Figure 15:
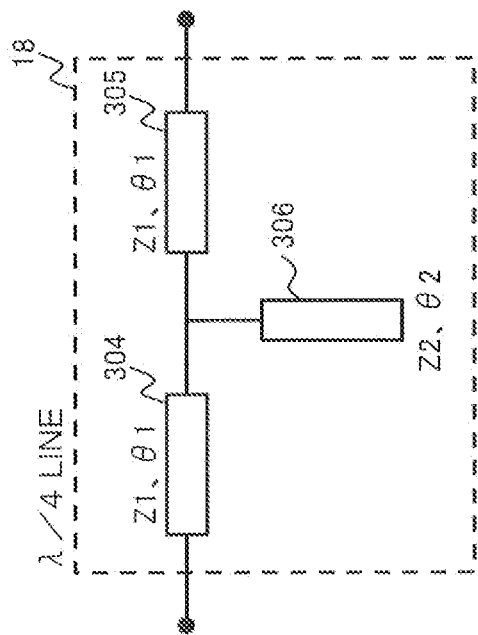
FIG. 15 is a diagram showing an example of a circuit configuration of a $\lambda/4$ line.

As described above, Non-Patent Literature 3 discloses $\lambda/4$ lines that can be used as output combining elements. Non-Patent Literature 3 discloses that a circuit equivalent to the $\lambda/4$ lines 18 which handle 2 bands can be configured by a transmission line 301 having characteristic impedance Z1 and electrical length $\theta 1$, and transmission lines 302 and 303 having characteristic impedance Z2 and electrical length $\theta 2$ (see FIG. 14). Or, Non-Patent Literature 3 discloses that a circuit equivalent to the $\lambda/4$ lines 18 which handle 2 bands can be configured by transmission lines 304 and 305 having characteristic impedance Z1 and electrical length $\theta 1$, and a transmission line 306 having characteristic impedance Z2 and electrical length $\theta 2$ (see FIG. 15). It is to be noted that $\lambda/4$ lines 18 for 3 bands or more can be realized by serially connecting a plurality of circuits shown in FIG. 14 or FIG. 15, and increasing the number of design parameters (characteristic impedance and electrical length).

Figure 16:
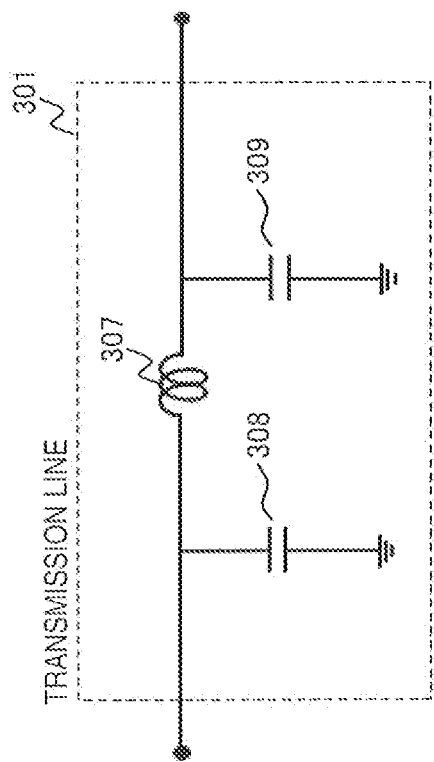
FIG. 16 is a diagram showing an example of a circuit configuration of a transmission line.

The transmission lines 301 to 306 can be configured by a lumped parameter element as shown in FIG. 16. That is, the transmission lines 301 to 306 can be configured by a lumped parameter element that uses an inductance element 307 and capacitive elements 308 and 309, as in the circuit configuration shown in FIG. 16. The transmission apparatus 10*b* shown in FIG. 13 also implements 2 forms of output power control: control of discrete output power by selecting power amplifiers 11 to be operated, and control of continuous output power by changing the output power ratio for respective bands. As a result, similar to the transmission apparatus 10, it is possible to curb an increase in the number of λ/4 lines 18 when multiband is realized.

Second Exemplary Embodiment

Next, a detailed description is given concerning a second exemplary embodiment, making reference to the drawings.

Figure 17:
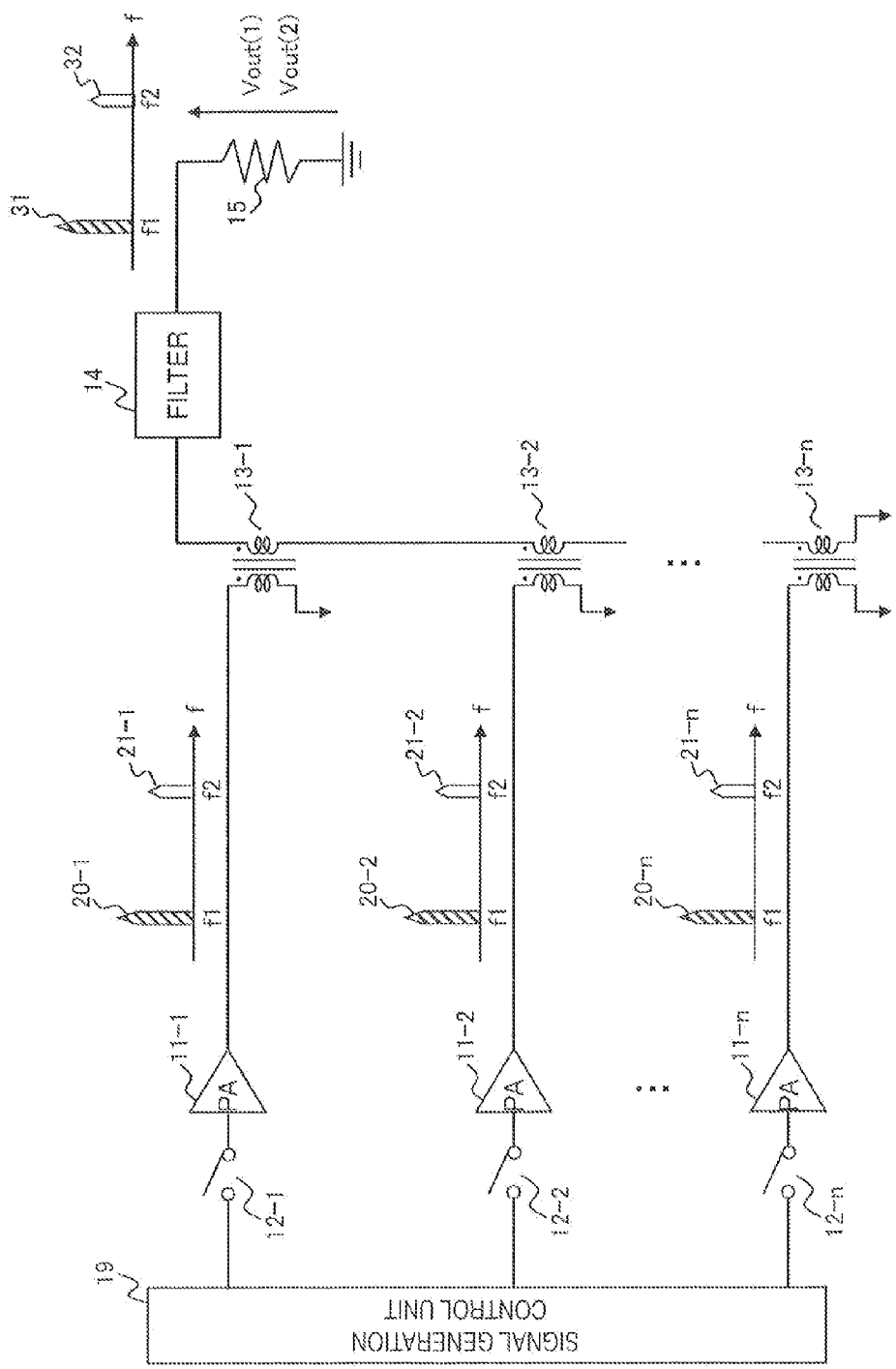
FIG. 17 is a diagram showing an example of a circuit configuration of a transmission apparatus 40 according to a second exemplary embodiment.

FIG. 17 is a diagram showing an example of a circuit configuration of a transmission apparatus 40 according to the second exemplary embodiment. A point of difference between the transmission apparatus 10 according to the first exemplary embodiment and the transmission apparatus 40 is that control of a signal generation control unit 19 is different from the signal generation control unit 16.

The transmission apparatus 40 causes a power amplifier 11-1 to operate analogically. Power amplifiers 11-2 to 11*n* outside of the power amplifier 11-1, similar to the first exemplary embodiment, perform ON/OFF operations (digital control) with operation being in a saturation state, or the operation state being OFF.

Figure 18:
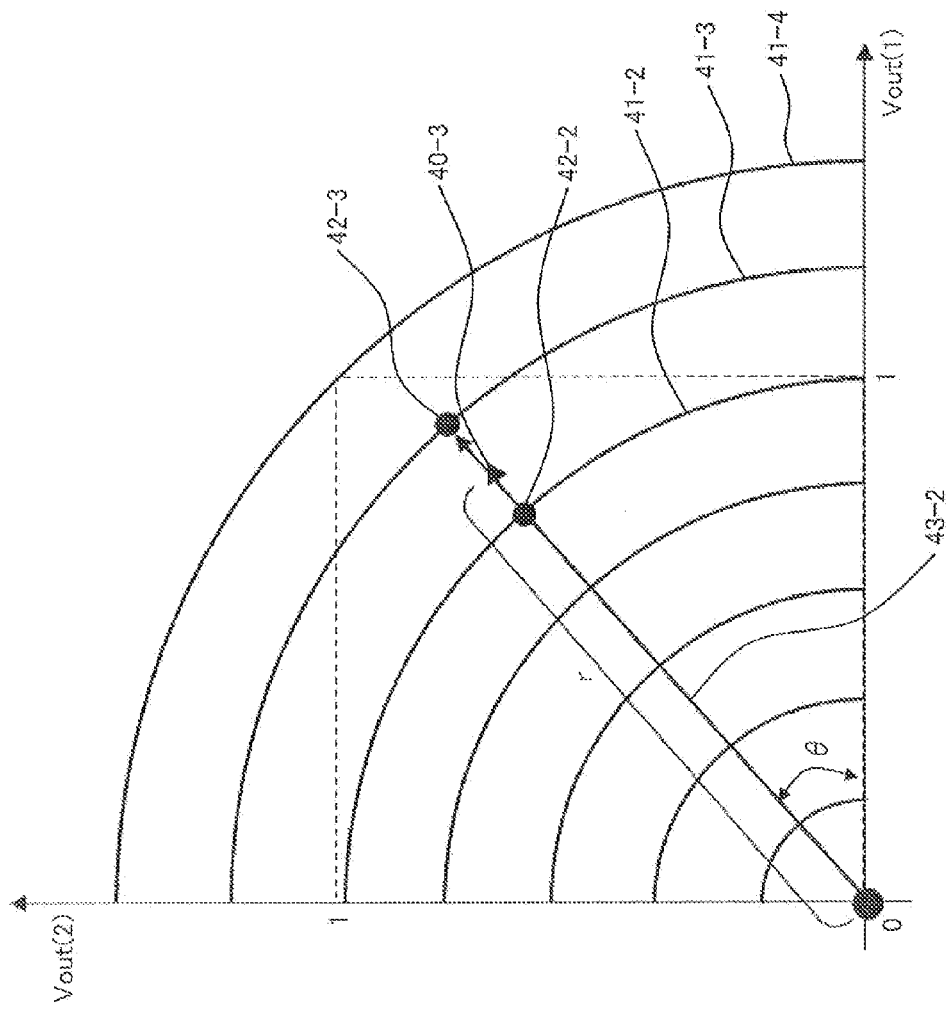
FIG. 18 is a diagram for describing control when output power of the transmission apparatus 40 is determined.

A description is given of operations of the transmission apparatus 40, making reference to FIG. 18. In the transmission apparatus 40, combined output of the power amplifiers 11-2 to 11-*n* that perform ON/OFF operations (digital operations) takes a value on a circle shown in FIG. 18, by selecting power amplifiers to be operated.

In FIG. 18, a desired output voltage is described as a target point 40-3. The intersection point of a circle 41-2 that has a radius smaller than the position of the target point 40-3 and is closest to the target point 40-3, and a straight line 43-2 linking the target point 40-3 and the origin and the circle 41-2 is 42-2. At this time, ON/OFF states of the power amplifiers 11-2 to 11-*n* are controlled so that combined output of the power amplifiers 11-2 to 11-*n* is at the intersection point 42-2.

A signal generation control unit 19 performs control so that output power of the power amplifier 11-1, which performs analog operations, is an output voltage equivalent to the difference between the target point 40-3 and the intersection point 42-2. In other words, the signal generation control unit 19 performs control of the amplitude of RF signals supplied to the power amplifier 11-1 so that the power of RF signals after signal amplification by the power amplifier 11-1 is equivalent to the power difference of the target point 40-3 and the intersection point 42-2.

Meanwhile, the intersection point of a circle 41-3 that has a radius larger than the position of the target point 40-3 and is closest to the target point 40-3, and a straight line 43-2 linking the target point 40-3 and the origin and the circle 41-3 is 42-3. By controlling the power amplifier 11-1, which performs analog operations, the signal generation control unit 19 can set output voltage range of the transmission apparatus 40 to between the intersection point 42-2 and the intersection point 42-3. By the signal generation control unit 19 performing analogical control of amplitude of the RF signals outputted to the power amplifier 11-1, the power consumed by the power amplifier 11-1 increases, but the transmission apparatus 40 can output a signal equivalent to the target point 40-3 in which no substantial error is present.

Here, if the difference between the target point 40-3 and combined output (point 42-2) of the power amplifiers 11-2 to 11-*n* that perform ON/OFF control (digital control) becomes large, the power consumed by the power amplifier 11-1 that performs analog operations also increases. Meanwhile, as described above, the larger the number (n−1) of power amplifiers 11-2 to 11-*n* that perform ON/OFF control, the lower the difference between the combined power and ideal signal, so that the power consumed by the power amplifier 11-1 that performs analog operations also decreases. In other words, there is a tradeoff relationship between the number of power amplifiers that perform ON/OFF operations (digital control) and the power consumed by the power amplifier that performs analog control.

As described in the first exemplary embodiment, in a case where the number of transmission apparatuses 200 provided is the same as the number of bands to be handled and multiband communication is realized, and in a case where multiband communication is realized by 1 transmission apparatus 10, quantization error (namely, differences between combined output and target point) is approximately the same. Therefore, in a case where the power amplifier 11-1 is made to operate analogically in the transmission apparatus 200, and in a case where the power amplifier 11-1 is made to operate analogically in the transmission apparatus 40, the power consumption is approximately the same.

Under the same power consumption conditions there is an advantage in that, while the number of output combining elements (for example, transformer elements) increases in proportion to the number of bands in the transmission apparatus 200, the number of output combining elements does not increase if the number of bands increases in the transmission apparatus 40. That is, in the tradeoff relationship of the number (n−1) of power amplifiers 11 that perform ON/OFF operations, and the power consumed by the power amplifiers that perform analog operations, the transmission apparatus 40 is advantageous. In addition, the larger the number of bands handled, the greater the superiority of the transmission apparatus 40. It is to be noted that in the transmission apparatuses 10*a* and 10*b* described using FIG. 12 and FIG. 13, it is possible to reduce error by performing analog control of the power amplifier 11-1.

As described above, the transmission apparatus 40 according to the second exemplary embodiment changes, as continuous values, the total power of RF signals received by a predetermined power amplifier (for example, power amplifier 11-1) among the plurality of power amplifiers 11, in accordance with the total power of transmitted RF signals, and the other power amplifiers 11-2 to 11-*n* are operated at saturation level. As a result, the transmission apparatus 40 can output signals with no substantial quantization error.

Next, a description is given concerning modified examples of the transmission apparatus 40 according to the second exemplary embodiment.

First Modified Example

The transmission apparatus 40*a* implements the power amplifiers 11-1 to 11-*n*, included in the transmission apparatus 40, as analog amplifiers that perform analog operations. Power amplifiers to be operated, among the power amplifiers 11-1 to 11-*n*, are selected by switches 12-1 to 12-*n*.

A description is given of operation of the transmission apparatus 40*a* using FIG. 18. In the transmission apparatus 40*a*, with k power amplifiers 11-*i* (k is an integer greater than or equal to 2 and less than n; the same applies below) (i=2 to k) operating in a saturated state, a signal at intersection point 42-2 is outputted to a load 15, and with k+1 power amplifiers 11-*i* (i=2 to k+1) operating in a saturated state, a signal at intersection point 42-3 is outputted to the load 15.

When a desired signal is at the target point 40-3 which is between the intersection point 42-2 and the intersection 42-3, by k+1 power amplifiers 11 reducing output power from saturated output at the same rate (back-off), the output amplification of RF signals is set so that the desired signal (target point 40-3) is outputted.

When a desired signal is between the circle 41-3 and the circle 41-4, by increasing the number of power amplifiers 11 to be operated to k+2, and the same power amplifiers 11-*i* (i=2 to k+2) performing back-off at the same rate, the output amplification of the RF signals is set so that the transmission apparatus 40*a* outputs the desired signal (target point 40-3).

Similar to the transmission apparatus 40, in the transmission apparatus 40*a* also, even if the number of bands handled increases, the number of output combining elements does not increase.

Second Modified Example

Figure 19:
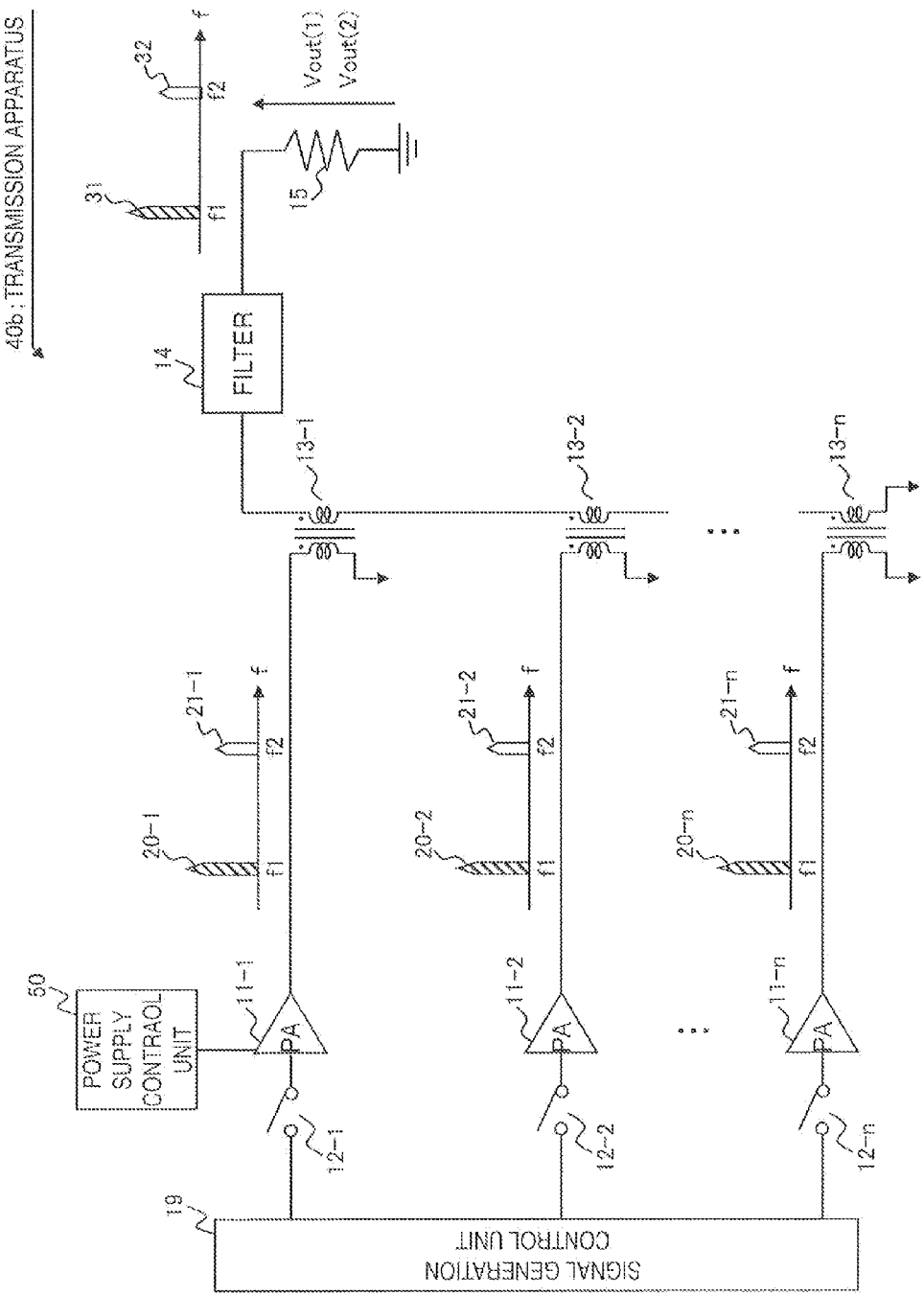
FIG. 19 is a diagram showing an example of a circuit configuration of a transmission apparatus 40b according to a second modified example of the second exemplary embodiment.

FIG. 19 is a diagram showing an example of a circuit configuration of a transmission apparatus 40*b*. A point of difference between the transmission apparatus 40 shown in FIG. 17 and the transmission apparatus 40*b* is that a power supply control unit 50 is connected to the power amplifier 11-1. The power supply control unit 50 controls power supply voltage of the power amplifier 11-1. The power supply control unit 50 changes power supply voltage of the power amplifier 11-1, with the total power of RF signals received being changed as continuous values.

In the transmission apparatus 40*b*, the power amplifier 11-1 performs saturated operation. At this time, the saturated output of the power amplifier 11-1 (total power of RF signal 20-1 and RF signal 21-1) can be continuously (analogically) changed in proportion to the square of the power supply voltage of the power amplifier 11-1. That is, in the transmission apparatus 40 according to the second exemplary embodiment the amplitude of the output signal of the power amplifier 11-1 is controlled according to amplitude of the RF signal received by the power amplifier 11-1, whereas in the transmission apparatus 40*b* the amplitude of the output signal of the power amplifier 11-1 is controlled by a change in the power supply voltage of the power amplifier 11-1.

It is to be noted that as an output combining element shown in FIG. 19, it is possible to use λ/4 lines, instead of transformer elements 13.

Unlike the transmission apparatus 40 according to the second exemplary embodiment, in the transmission apparatus 40*b* the power amplifier 11-1 itself performs saturated operation, so that it is possible for power consumption of the power amplifier 11-1 that performs analog operations to be kept low. However, if the output power of the power amplifier 11-1 that performs analog operations is large, the power consumption of the power supply control unit 50 increases. Therefore it is preferable that error is small in combined output of the power amplifiers 11-*i* (i=2 to n) that perform ON/OFF operations (digital operations), which are the reason for increase in output power of the power amplifier 11-1 that performs analog operations.

Similar to the transmission apparatus 40, in the transmission apparatus 40*b* also, the number of output combining elements does not increase even if the number of bands handled increases.

Some of all of the abovementioned exemplary embodiments may also be described as in the following modes, but there is no limitation to the following.

<First Mode>
As in the transmission apparatus according to the first aspect described above.

<Second Mode>
The transmission apparatus according to the first mode, wherein the second control unit changes power ratios of RF signals for respective bands in each of the selected amplification units such that each of the selected amplification units performs saturated operation.

<Third Mode>
The transmission apparatus according to the first or second mode, wherein the second control unit changes, as continuous values, the total power of RF signals received by a predetermined power amplification unit among the plurality of power amplification units, in accordance with the total power of transmitted RF signals, and other power amplification units are operated at saturation level.

<Fourth Mode>
The transmission apparatus according to the third mode, further provided with a power supply control unit that changes power supply voltage of the predetermined amplification unit.

<Fifth Mode>
The transmission apparatus according to any one of the first to fourth modes, wherein the second control unit changes the power ratio of the RF signals in the respective bands, so that the power ratios of RF signals in the respective bands outputted by the respective selected power amplifiers are the same in each of the amplifiers.

<Sixth Mode>
The transmission apparatus according to any one of the first to fifth modes, wherein the combining unit is configured by the same number of transformer elements as the plurality of amplifiers, a primary side of the transformer elements and the corresponding amplifier are connected, and secondary sides of the transformer elements are connected in series.

<Seventh Mode>
The transmission apparatus according to any one of the first to fifth modes, wherein the combining unit is configured by the same number of transmission line elements as the plurality of amplifiers, one end of the transmission line elements and the corresponding amplifier are connected, and the other ends of the plurality of transmission line elements are connected in parallel.

<Eighth Mode>
The transmission apparatus according to the seventh mode, wherein the transmission line elements are configured by lumped parameter elements.

<Ninth Mode>
As in the transmission method according to the second aspect described above.

<Tenth Mode>
The transmission method according to the ninth mode, wherein the second control step changes the power ratios of RF signals for respective bands in each of the selected amplification units such that each of the selected amplification units performs saturated operation.

<Eleventh Mode>
The transmission method according to the ninth or tenth mode, wherein the second control step changes the total power of RF signals received by a predetermined amplification units among the plurality of amplification units, in accordance with the total power of transmitted RF signals, and the other amplification units are operated at saturation level.

<Twelfth Mode>

The transmission method according to the eleventh mode, further including a step of changing power supply voltage of the predetermined amplification units.

It is to be noted that the various disclosures of the cited Patent Literature described above are incorporated herein by reference thereto. Modifications and adjustments of exemplary embodiments and examples may be made within the bounds of the entire disclosure (including the scope of the claims) of the present invention, and also based on fundamental technological concepts thereof. Various combinations and selections of various disclosed elements (including respective elements of the respective claims, respective elements of the respective exemplary embodiments and examples, respective elements of the respective drawings and the like) are possible within the scope of the entire disclosure of the present invention. That is, the present invention clearly includes every type of transformation and modification that a person skilled in the art can realize according to the entire disclosure including the scope of the claims and to technological concepts thereof. In particular, with regard to numerical ranges described in the present specification, arbitrary numerical values and small ranges included in the relevant ranges should be interpreted to be specifically described even where there is no particular description thereof.

The invention claimed is:

1. A transmission apparatus, comprising:
a plurality of power amplifiers configured to amplify radio frequency (RF) signals arranged in at least two bands;
a plurality of switches connected to each of the plurality of power amplifiers;
a signal generation control unit that is connected to the plurality of switches, wherein the signal generation control unit is configured to:
perform a first control that selects power amplifiers that perform an amplification operation, from among said plurality of power amplifiers, in accordance with total power of RF signals to be transmitted; and
perform a second control which, in accordance with a power ratio of the RF signals to be transmitted in respective bands, changes the power ratio of the RF signals in the respective bands while keeping constant the total power of the RF signals received at each of said selected power amplifiers; and
a combining unit configured to combine the RF signals outputted by said selected power amplifiers.

2. The transmission apparatus according to claim 1, wherein said signal generation control unit is further configured to change the power ratios of RF signals for respective bands in each of said selected power amplifiers such that each of said selected power amplifiers performs saturated operation.

3. The transmission apparatus according to claim 1, wherein said signal generation control unit is further configured to change, as continuous values, the total power of RF signals received by a predetermined power amplifier among said plurality of power amplifiers, in accordance with the total power of transmitted RF signals, and cause other power amplifiers to operate at saturation level.

4. The transmission apparatus according to claim 3, further comprising a power supply control unit configured to change power supply voltage of said predetermined power amplifier.

5. The transmission apparatus according to claim 1, wherein said signal generation control unit is further configured to change the power ratio of the RF signals in the respective bands, so that the power ratios of RF signals in the respective bands outputted by said respective selected power amplifiers are the same in each of said power amplifiers.

6. The transmission apparatus according to claim 1, wherein
said combining unit is configured by a same number of transformer elements as said plurality of power amplifiers,
a primary side of said transformer elements and a corresponding power amplifier are connected, and
secondary sides of said transformer elements are connected in series.

7. The transmission apparatus according to claim 1, wherein said combining unit is configured by a same number of transmission line elements as said plurality of power amplifiers, one end of said transmission line elements and a corresponding power amplifier are connected, and the other ends of said plurality of transmission line elements are connected in parallel.

8. The transmission apparatus according to claim 7, wherein said transmission line elements are configured by lumped parameter elements.

9. A transmission method of amplifying radio frequency (RF) signals by a plurality of power amplifiers that are connected to a plurality of switches, and transmitting the RF signals, said method comprising:
amplifying RF signals arranged in at least two bands, in a plurality of power amplifiers;
selecting power amplifiers that perform an amplification operation, from among said plurality of power amplifiers, in accordance with total power of RF signals to be transmitted;
changing, in accordance with a power ratio of the RF signals to be transmitted in respective bands, the power ratio of the RF signals in the respective bands while keeping constant the total power of RF signals received at each of said selected power amplifiers; and
combining the RF signals outputted by said selected power amplifiers.

10. The transmission method according to claim 9, wherein in changing the power ratio of the RF signals, the power ratios of RF signals for respective bands in each of said selected power amplifiers is changed such that each of said selected power amplifiers performs saturated operation.

* * * * *

UNITED STATES PATENT AND TRADEMARK OFFICE
CERTIFICATE OF CORRECTION

PATENT NO.        : 9,847,761 B2
APPLICATION NO.   : 14/888472
DATED             : December 19, 2017
INVENTOR(S)       : Shingo Yamanouchi and Atsushi Honda Page 1 of 1

It is certified that error appears in the above-identified patent and that said Letters Patent is hereby corrected as shown below:

In the Specification

Column 2, Line 10:
Delete "600-69" and insert --600-609--

Signed and Sealed this
Twenty-second Day of January, 2019

Andrei Iancu
*Director of the United States Patent and Trademark Office*